United States Patent
Nakagawa

(10) Patent No.: US 10,418,967 B2
(45) Date of Patent: Sep. 17, 2019

(54) RESONATOR ELEMENT, MANUFACTURING METHOD FOR RESONATOR ELEMENT, RESONATOR, ELECTRONIC DEVICE, AND MOVING OBJECT

(71) Applicant: Seiko Epson Corporation, Tokyo (JP)

(72) Inventor: Naohiro Nakagawa, Suwa (JP)

(73) Assignee: Seiko Epson Corporation (JP)

( * ) Notice: Subject to any disclaimer, the term of this patent is extended or adjusted under 35 U.S.C. 154(b) by 659 days.

(21) Appl. No.: 14/807,107

(22) Filed: Jul. 23, 2015

(65) Prior Publication Data

US 2016/0028370 A1 Jan. 28, 2016

(30) Foreign Application Priority Data

Jul. 25, 2014 (JP) ................. 2014-151841

(51) Int. Cl.
*H03H 9/215* (2006.01)
*H03H 3/02* (2006.01)

(52) U.S. Cl.
CPC ............. *H03H 9/215* (2013.01); *H03H 3/02* (2013.01); *H03H 2003/026* (2013.01)

(58) Field of Classification Search
CPC ........ H03H 9/21; H03H 9/215; H03H 9/2468; H03H 9/2473; H03H 9/2484; H03H 9/2494; H03H 2003/026; H03H 2003/0492; H03H 3/04
See application file for complete search history.

(56) References Cited

U.S. PATENT DOCUMENTS

| | | | | |
|---|---|---|---|---|
| 7,545,237 B2* | 6/2009 | Hagelin | .................. | H02N 1/008 310/309 |
| 2005/0054153 A1 | 3/2005 | Asami et al. | | |
| 2006/0057816 A1 | 3/2006 | Benzel et al. | | |
| 2008/0150655 A1* | 6/2008 | Hagelin | ............. | H03H 9/02244 333/200 |
| 2008/0211350 A1* | 9/2008 | Tanaya | ..................... | H03H 3/04 310/328 |
| 2012/0007685 A1* | 1/2012 | Yamada | ............. | H03H 9/02102 331/156 |

FOREIGN PATENT DOCUMENTS

| | | |
|---|---|---|
| JP | S49-109527 U | 9/1974 |
| JP | 62-071317 A | 4/1987 |
| JP | 04-364726 A | 12/1992 |
| JP | 2000-031123 A | 1/2000 |
| JP | 2005-086079 A | 3/2005 |
| JP | 2006-075981 A | 3/2006 |
| JP | 2007-013383 A | 1/2007 |
| JP | 2008-131527 A | 6/2008 |
| JP | 2012-029023 A | 2/2012 |

\* cited by examiner

*Primary Examiner* — J. San Martin
(74) *Attorney, Agent, or Firm* — Harness, Dickey & Pierce, P.L.C.

(57) ABSTRACT

To realize a resonator element capable of obtaining sufficient electric field efficiency and securing a satisfactory element characteristic, a resonator element of the invention includes a base section and a pair of resonating arms extending from the base section. The resonator element includes recesses having a curved surface shape respectively on two side surfaces (surfaces crossing a direction in which the resonating arms resonate) of the resonating arm.

15 Claims, 20 Drawing Sheets

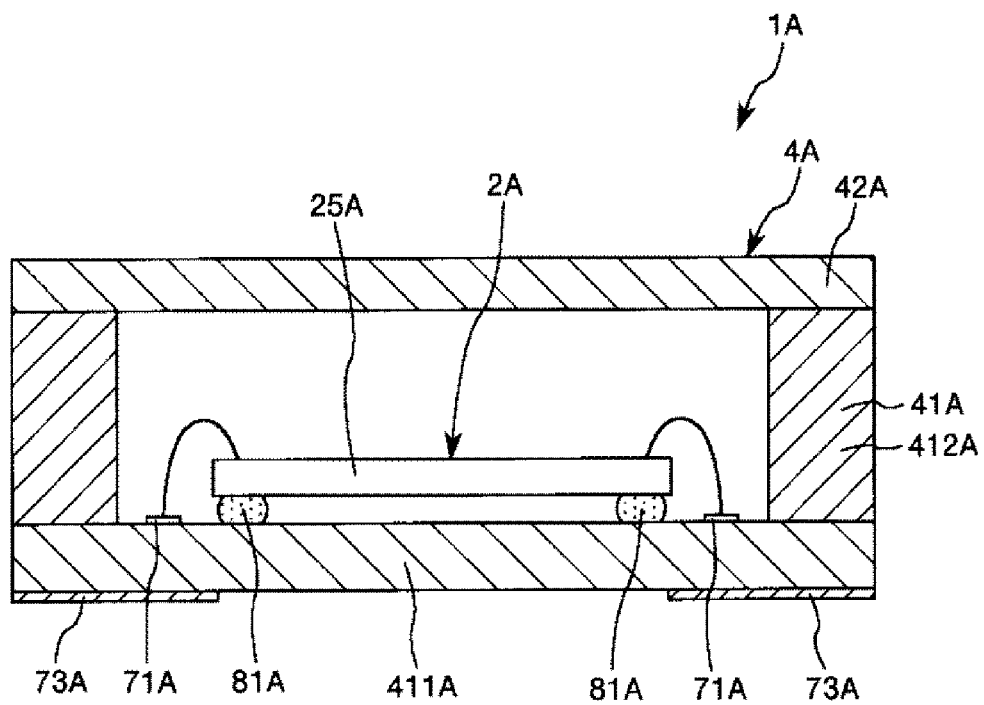
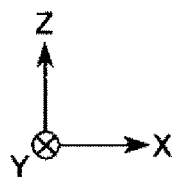
FIG. 8

RESONATOR ELEMENT, MANUFACTURING METHOD FOR RESONATOR ELEMENT, RESONATOR, ELECTRONIC DEVICE, AND MOVING OBJECT

BACKGROUND

1. Technical Field

The present invention relates to a resonator element, a manufacturing method for the resonator element, a resonator, an electronic device, and a moving object.

2. Related Art

A resonator element including quartz crystal has been known. Such a resonator element is widely used as reference frequency sources of various electronic devices, transmission sources, gyro sensors, and the like.

The resonator element is manufactured by patterning abase material using, for example, a plasma dry etching method, to obtain a work piece (a structure) having a predetermined shape. Consequently, a resonating arm included in the resonator element can have a perpendicular sectional shape excellent in symmetry. It is known that this is effective for securing highly accurate resonation characteristics (a frequency and the like) of the resonator element (see JP-A-2007-13383 (Patent Literature 1)).

However, for example, when the resonating arm included in the resonator element is formed in a perpendicular sectional shape along a direction crossing the longitudinal direction of the resonating arm, a surface area for picking up charges decreases as the element is reduced in size. Sufficient electric field efficiency is not obtained. Therefore, it is sometimes difficult to obtain a satisfactory Q value.

SUMMARY

An advantage of some aspects of the invention is to provide a resonator element capable of obtaining sufficient electric field efficiency and securing a satisfactory element characteristic, a manufacturing method for the resonator element capable of manufacturing the resonator element, and a resonator, an electronic device, and a moving object including the resonator element.

The invention can be implemented as the following forms or application examples.

APPLICATION EXAMPLE 1

A resonator element according to this application example of the invention includes a resonating arm including a recess on a surface crossing a resonating direction.

With this configuration, it is possible to increase a surface area of the surface. Therefore, it is possible to attain improvement of electric field efficiency. During resonation in an in-plane direction of the resonator element, it is possible to reduce a thermoelastic loss and secure a satisfactory Q value. As a result, even if the resonator element is reduced in size, it is possible to obtain sufficient electric field efficiency and secure satisfactory element characteristics.

APPLICATION EXAMPLE 2

In the resonator element according to the application example of the invention, it is preferable that two surfaces crossing the resonating direction of the resonating arm respectively includes recesses.

With this configuration, the balance of the resonating arm is secured. It is possible to reduce unnecessary resonation (specifically, oblique resonation having an out-of-plane direction component) and efficiently cause the resonating arm to oscillate in an in-plane direction of a resonator substrate.

APPLICATION EXAMPLE 3

In the resonator element according to the application example of the invention, it is preferable that the recesses of the two surfaces have symmetry.

With this configuration, since the balance of the resonating arm is further secured, it is possible to more efficiently cause the resonating arm to oscillate in the in-plane direction of the resonator substrate.

APPLICATION EXAMPLE 4

In the resonator element according to the application example of the invention, it is preferable that the recess includes a curved surface.

With this configuration, since the balance of the resonating arm is further secured, it is possible to more efficiently cause the resonating arm to oscillate in the in-plane direction of the resonator substrate.

APPLICATION EXAMPLE 5

In the resonator element according to the application example of the invention, it is preferable that the surface crossing the resonating direction includes the recess and a portion having a curvature smaller than a curvature of the recess.

With this configuration, it is possible to more stably perform the resonation in the in-plane direction of the resonator element.

APPLICATION EXAMPLE 6

In the resonator element according to the application example of the invention, it is preferable that quartz crystal is included in a material of the resonating arm.

APPLICATION EXAMPLE 7

It is preferable that the resonator element according to the application example of the invention is formed in a tuning fork shape.

APPLICATION EXAMPLE 8

A manufacturing method for a resonator element according to this application example of the invention includes: forming a mask on a base material; and processing the base material with a dry etching method using the mask to form a resonator element including a resonating arm. In the forming the resonator element, a recess is formed on a surface crossing a resonating direction of the resonating arm.

With this configuration, even if the resonator element is reduced in size, it is possible to obtain sufficient electric field efficiency and obtain the resonator element with satisfactory element characteristics secured.

APPLICATION EXAMPLE 9

In the manufacturing method for the resonator element according to the application example of the invention, it is preferable that, in the forming the resonator element, the recess is formed by a plasma etching method using a CF-based reactive gas.

With this configuration, by appropriately setting conditions of the plasma etching method, it is possible to easily form the surface as a surface including the recess.

APPLICATION EXAMPLE 10

In the manufacturing method for the resonator element according to the application example of the invention, it is preferable that, in the forming the resonator element, an isotropic plasma component is increased from an etching condition for using an anisotropic plasma component.

With this configuration, it is possible to process the base material at satisfactory pattern dimension accuracy and form a plane section and the recess at excellent dimension accuracy.

APPLICATION EXAMPLE 11

In the manufacturing method for the resonator element according to the application example of the invention, it is preferable that a change in the etching condition is a change of at least one kind among pressure in a chamber, a heating temperature of the base material, a gas type, and bias power.

With this configuration, with relatively easy operation for changing the etching condition, it is possible to change the CF-based reactive gas to the isotropic plasma component and the anisotropic plasma component.

APPLICATION EXAMPLE 12

A resonator according to this application example of the invention includes: the resonator element according to the application example of the invention; and a package in which the resonator element is housed.

With this configuration, it is possible to obtain the resonator having high reliability.

APPLICATION EXAMPLE 13

An electronic device according to this application example of the invention includes the resonator element according to the application example of the invention.

With this configuration, it is possible to obtain the electronic device having high reliability.

APPLICATION EXAMPLE 14

A moving object according to this application example of the invention includes the resonator element according to the application example of the invention.

With this configuration, it is possible to obtain the moving object having high reliability.

BRIEF DESCRIPTION OF THE DRAWINGS

The invention will be described with reference to the accompanying drawings, wherein like numbers reference like elements.

FIG. 8 is a cross sectional view of the resonator shown in FIG. 7.

FIGS. 9A and 9B are diagrams showing a resonating arm for driving of the resonator shown in FIG. 7, wherein FIG. 9A is an enlarged plan view and FIG. 9B is an enlarged cross sectional view.

FIGS. 10A and 10B are diagrams showing an resonating arm for detection of the resonator shown in FIG. 7, wherein FIG. 10A is an enlarged plan view and FIG. 10B is an enlarged cross sectional view.

DESCRIPTION OF EXEMPLARY EMBODIMENTS

A resonator element, a manufacturing method for the resonator element, a resonator, an electronic device, and a moving object according to the invention are explained in detail below on the basis of embodiments shown the accompanying drawings.

1. Resonator

First, a resonator according to the invention is explained.

First Embodiment

Figure 1:
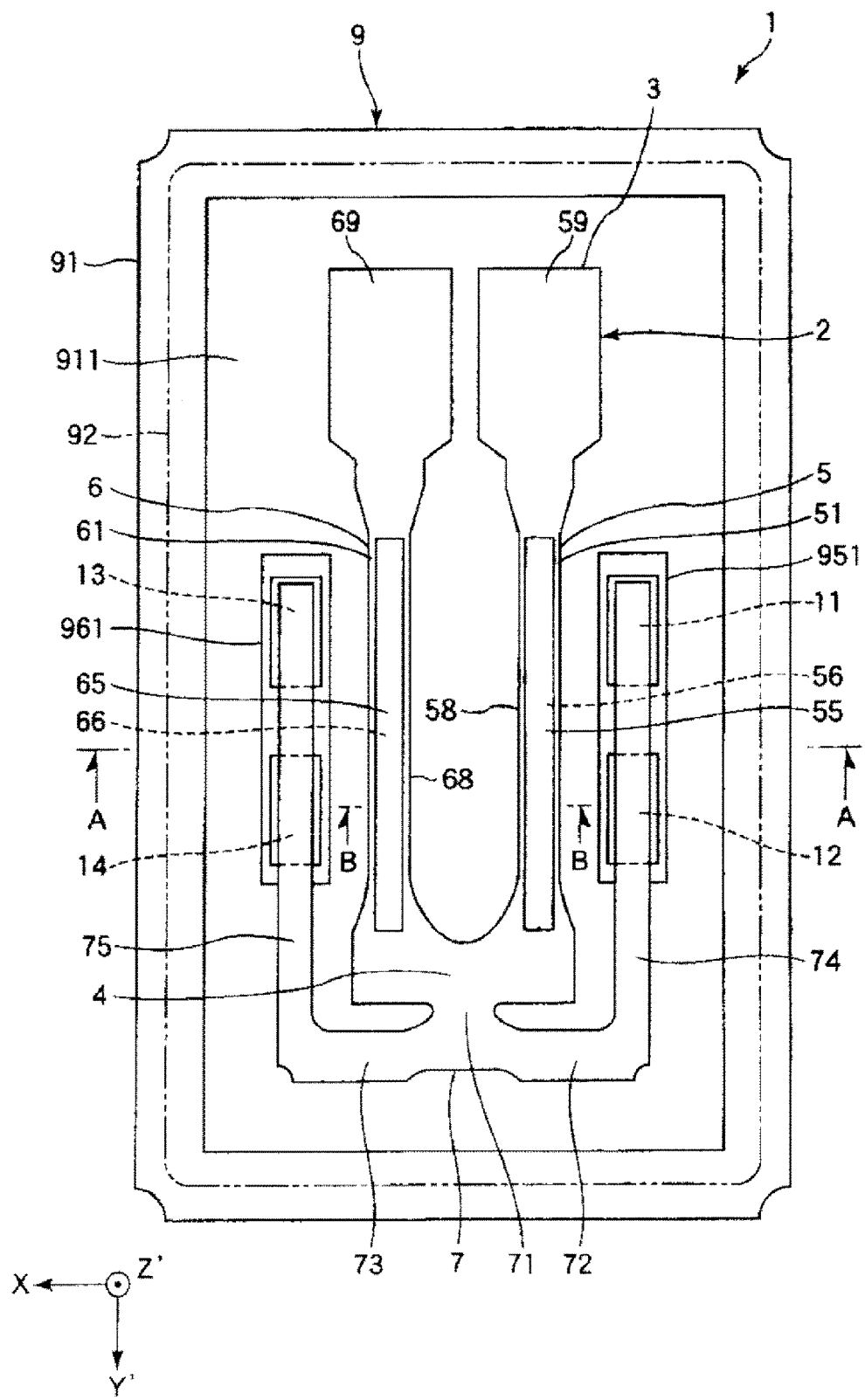
FIG. 1 is a plan view showing a first embodiment of a resonator according to the invention.
Figure 2:
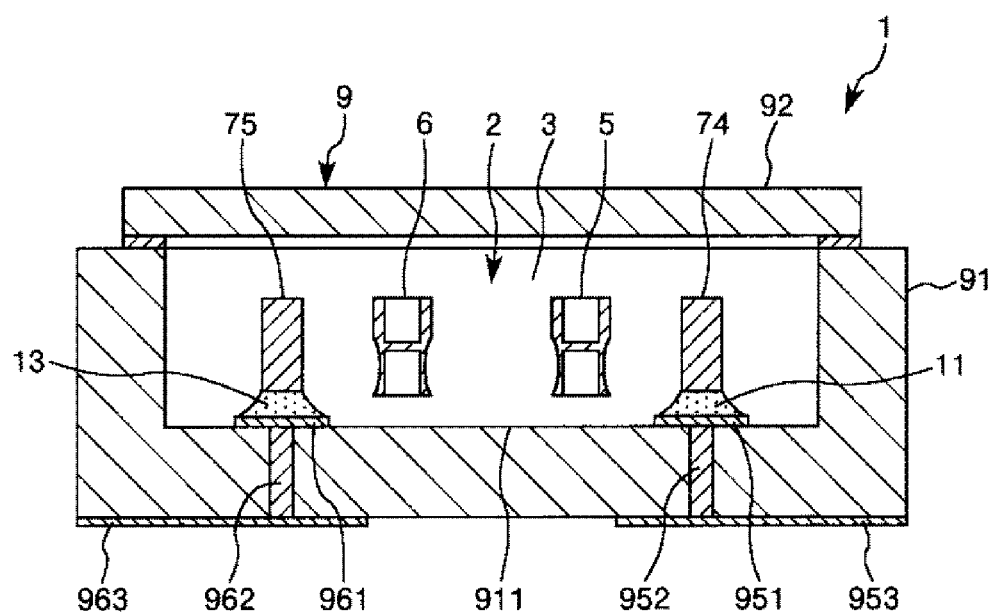
FIG. 2 is an A-A line sectional view of FIG. 1.
Figure 3:
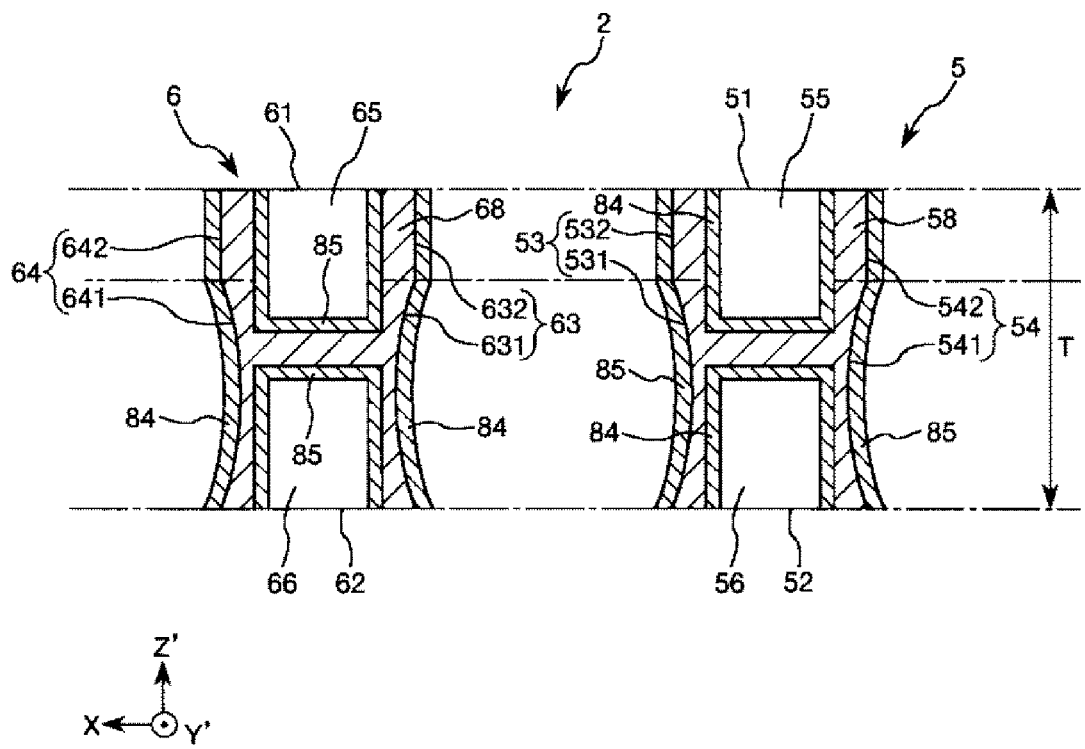
FIG. 3 is a sectional view (a B-B line sectional view of FIG. 1) of a resonator element of the resonator shown in FIG. 1.

FIG. 1 is a plan view showing a first embodiment of the resonator according to the invention. FIG. 2 is an A-A line sectional view of FIG. 1. FIG. 3 is a sectional view (a B-B line sectional view of FIG. 1) of a resonator element of the resonator shown in FIG. 1. FIGS. 4A to 6B are respectively sectional views for explaining a manufacturing method for the resonator element of the resonator shown in FIG. 1.

An resonator 1 shown in FIGS. 1 and 2 includes a resonator element 2 and a package 9 that houses the resonator element 2. The resonator element 2 and the package 9 are explained in detail below in order.

Resonator Element

As shown in FIGS. 1 to 3, the resonator element 2 in this embodiment includes a resonator substrate (a work piece) 3 and first and second electrodes for driving 84 and 85 formed on the resonator substrate 3. Note that, in FIGS. 1 and 2, for convenience of explanation, the first and second electrodes for driving 84 and 85 are not shown.

In this embodiment, the resonator substrate 3 is mainly configured by a Z-cut quartz crystal plate. The Z-cut quartz crystal plate is a quartz crystal plate, a thickness direction of which is generally a Z axis. Note that the thickness direction of the resonator substrate 3 and the Z axis may coincide with each other. However, from the viewpoint of reducing a frequency temperature change near the normal temperature, the Z axis slightly tilts with respect to the thickness direction. That is, when a tilting angle is set to θ degrees ($-5° \leq \theta \leq 15°$), in an orthogonal coordinate system including an X axis serving as an electric axis of the quartz crystal, a Y axis serving as a mechanical axis, and a Z axis serving an optical axis, an axis obtained by tilting the Z axis θ degrees to rotate a +Z side in a −Y direction of the Y axis around the X axis serving as a rotation axis is represented as a Z' axis and an axis obtained by tilting the Y axis θ degrees to rotate a +Y side in a +Z direction of the Z axis around the X axis serving as a rotation axis is represented as a Y' axis. Then, a direction along the Z' axis is the thickness of the resonator substrate 3. A surface including the X axis and the Y' axis is a principal plane of the resonator substrate 3. Note that, in the figures, the X axis, the Y' axis, and the Z' axis are shown.

The resonator substrate 3 has a Y'-axis direction in a length direction, has an X-axis direction in a width direction, and has a Z'-axis direction in a thickness direction. The resonator substrate 3 has substantially the same thickness over the entire region thereof (excluding a region where grooves 55, 56, 65, and 66 explained below are formed). Thickness (length in the Z'-axis direction) T of the resonator plate 3 is not particularly limited. However, the thickness T is preferably 110 μm or more and 150 μm or less and more preferably 120 μm or more and 130 μm or less. Consequently, sufficient mechanical strength is obtained. It is possible to easily create a fine shape with anisotropic plasma etching while increasing a Q value and reducing a CI value. That is, when the thickness T of the resonator substrate 3 is smaller than the lower limit value, depending on other conditions, the Q value decreases and the CI value increases. It is likely that the mechanical strength is insufficient and the resonator substrate 3 is broken. When the thickness T of the resonator substrate 3 exceeds the upper limit value, it is likely that this leads to an excessive increase in the size of the resonator element 2.

The resonator substrate 3 includes a base section 4, a pair of resonating arms 5 and 6 extending from the base section 4, and a supporting section 7 extending from the base section 4.

The base section 4 is formed in a plate shape spreading on an XY' plane and having thickness in the Z'-axis direction. The supporting section 7 includes a branching section 71 extending from the lower end of the base section 4 and branching in the X-axis direction, coupling arms 72 and 73 extending from the branching section 71 to both sides in the X-axis direction, and supporting arms 74 and 75 extending from distal end portions of the coupling arms 72 and 73 in the −Y'-direction.

The resonating arms 5 and 6 are formed in a tuning fork shape extending from an end on the −Y'-axis side of the base section 4 in the −Y'-axis direction (a first direction) to be arranged along the X-axis direction (a second direction) and parallel to each other. The resonating arms 5 and 6 are respectively formed in longitudinal shapes. Proximal ends (ends on the +Y'-axis side) of the resonating arms are fixed ends and distal ends (ends on the −Y'-axis side) of the resonating arm are free ends. The resonating arms 5 and 6 respectively include arm sections 58 and 68 extending from the base section 4 and hammerheads (wide sections) 59 and 69 functioning as weight sections provided at the distal end portions of the arm sections 58 and 68 and wider than the arm sections 58 and 68. By providing the hammerheads 59 and 69 at the distal end portions of the resonating arms 5 and 6 in this way, it is possible to reduce the resonating arms 5 and 6 in length and attain a reduction in the size of the resonator element 2. Since the resonating arms 5 and 6 can be reduced in length, resonation speed of the resonating arms 5 and 6 at the time when the resonating arms 5 and 6 are oscillated at the same frequency can be reduced from the resonation speed in the past. Therefore, it is possible to reduce air resistance when the resonating arms 5 and 6 oscillate. Therefore, the Q value increases and the resonation characteristic can be improved. Note that the resonating arms 5 and 6 are formed in the same configuration (shape and size) each other.

As shown in FIG. 3, the resonating arm 5 includes a pair of principal planes (an upper surface and a lower surface) 51 and 52, which are in a front-back relation each other, configured by the XY' plane and a pair of side surfaces (surfaces crossing the resonating direction of the resonating arm 5) 53 and 54 configured by a Y'Z' plane and connecting the pair of principal planes 51 and 52.

The resonating arm 5 includes a bottomed groove 55 opening to the principal plane 51 and a bottomed groove 56 opening to the principal plane 52. The grooves 55 and 56 extend in the Y'-axis direction. The grooves 55 and 56 extend to the distal end portion of the arm section 58 to include the proximal end portion of the arm section 58 of the resonating arm 5. The resonating arm 5 is formed in a cross sectional shape of a generally H-type in a portion where the grooves 55 and 56 are formed.

Further, the side surfaces 53 and 54 respectively include recesses 531 and 541 located on the principal plane 52 side and extending in the Y'-axis direction and plane sections (straight sections) 532 and 542 located on the principal plane 51 side of the resonating arm 5 and having a curvature smaller than the curvature in the recesses 531 and 541.

In this way, since the side surfaces 53 and 54 include the recesses 531 and 541, it is possible to increase the surface area of the side surfaces 53 and 54. Therefore, it is possible to attain improvement of electric field efficiency. During resonation in an in-plane direction of the resonator element 2 (the resonator substrate 3), it is possible to reduce a thermoelastic loss and secure a satisfactory Q value. Consequently, even if the resonator element 2 is reduced in size, it is possible to obtain sufficient electric field efficiency and secure a satisfactory element characteristic. Since the side surfaces 53 and 54 include the plane sections 532 and 542, it is possible to more stably perform the resonation in the in-plane direction of the resonator element 2 (the resonator substrate 3). Further, by appropriately setting the area of the plane sections 632 and 642, it is possible to set the frequency of the resonating arm 6 to a desired frequency.

As shown in FIG. 3, the recesses 531 and 541 are provided in both of the side surfaces 53 and 54. Consequently, the balance of the resonating arm 5 is secured. It is possible to reduce unnecessary resonation (specifically, oblique resonation having an out-of-plane direction component) of the resonating arm 5. It is possible to efficiently cause the resonating arm 5 to oscillate in the in-plane direction of the resonator substrate 3.

The recesses 531 and 541 are formed further on the inner side than a straight line connecting the end portion of the principal plane (the upper surface) 51 and the end portion of the principal plane (the lower surface) 52. Consequently, it is possible to increase the surface area of the side surfaces 53 and 54 without causing an increase in the size of the resonating arm 5.

Further, the recesses 531 and 541 have symmetry. More specifically, the recesses 531 and 541 are configured by curved concave surfaces having symmetry. Consequently, the balance of the resonating arm 5 is further secured. Therefore, it is possible to more efficiently cause the resonating arm 5 to oscillate in the in-plane direction of the resonator substrate 3.

Like the resonating arm 5, the resonating arm 6 includes a pair of principal planes 61 and 62, which are in a front-back relation each other, configured by the XY' plane and a pair of side surfaces 63 and 64 configured by the Y'Z' plane and connecting the pair of principal planes 61 and 62. The resonating arm 6 includes a bottomed groove 65 opening to the principal plane 61 and a bottomed groove 66 opening to the principal plane 62. The grooves 65 and 66 extend in the Y'-axis direction. The grooves 65 and 66 extend to the distal end portion of the arm section 68 to include the proximal end portion of the arm section 68 of the resonating arm 6. The resonating arm 6 is formed in a cross sectional shape of a generally H-type in a portion where the grooves 65 and 66 are formed.

In the resonator element 2, since the grooves 55, 56, 65, and 66 are formed in the resonating arms 5 and 6, it is possible to attain a reduction in the thermoelastic loss. It is possible to exhibit an excellent resonation characteristic with deterioration in the Q value reduced.

Further, the side surfaces 63 and 64 respectively include recesses 631 and 641 located on the principal plane 62 side and extending in the Y'-direction and plane sections (straight sections) 632 and 642 located on the principal plane 61 side of the resonating arm 6 and having a curvature smaller than the curvature in the recesses 631 and 641.

Since the side surfaces 63 and 64 include the recesses 631 and 641, it is possible to increase the surface area of the side surfaces 63 and 64. Therefore, it is possible to attain improvement of electric field efficiency. During resonation in the in-plane direction of the resonator element 2 (the resonator substrate 3), it is possible to reduce a thermoelastic loss and secure a satisfactory Q value. Consequently, even if the resonator element 2 is reduced in size, it is possible to obtain sufficient electric field efficiency and secure a satisfactory element characteristic. Since the side surfaces 63 and 64 include the plane sections 632 and 642, it is possible to more stably perform the resonation in the in-plane direction of the resonator element 2 (the resonator substrate 3). Further, by appropriately setting the area of the plane sections 632 and 642, it is possible to set the frequency of the resonating arm 6 to a desired frequency.

As shown in FIG. 3, the recesses 631 and 641 are provided in both of the side surfaces 63 and 64. Consequently, the balance of the resonating arm 6 is secured. It is possible to reduce unnecessary resonation (specifically, oblique resonation having an out-of-plane direction component) of the resonating arm 6. It is possible to efficiently cause the resonating arm 6 to oscillate in the in-plane direction of the resonator substrate 3.

The recesses 631 and 641 are formed further on the inner side than a straight line connecting the end portion of the principal plane (the upper surface) 61 and the end portion of the principal plane (the lower surface) 62. Consequently, it is possible to increase the surface area of the side surfaces 63 and 64 without causing an increase in the size of the resonating arm 6.

Further, the recesses 631 and 641 have symmetry. More specifically, the recesses 631 and 641 are configured by curved concave surfaces having symmetry. Consequently, the balance of the resonating arm 6 is further secured. Therefore, it is possible to more efficiently cause the resonating arm 6 to oscillate in the in-plane direction of the resonator substrate 3.

In the resonator element 2, since the recesses 531, 541, 631, and 641 are formed in the resonating arms 5 and 6, even if the resonator element 2 is reduced in size, it is possible to obtain sufficient electric field efficiency and secure a satisfactory element characteristic.

In the resonating arm 5, a pair of first electrodes for driving 84 and a pair of second electrodes for driving 85 are formed. Specifically, one of the first electrodes for driving 84 is formed on the inner surface of the groove 55 and the other is formed on the inner surface of the groove 56. One of the second electrodes for driving 85 is formed on the side surface 53 and the other is formed on the side surface 54. Similarly, in the resonating arm 6, the pair of first electrodes for driving 84 and the pair of second electrodes for driving 85 are formed. Specifically, one of the first electrodes for driving 84 is formed on the side surface 63 and the other is formed on the side surface 64. One of the second electrodes for driving 85 is formed on the inner surface of the groove 65 and the other is formed on the inner surface of the groove 66. When an alternating voltage is applied to the first and second electrodes for driving 84 and 85, the resonating arms 5 and 6 oscillate at a predetermined frequency in the in-plane direction (the XY' plane direction) to repeat approach and separation each other.

The constituent material of the first and second electrodes for driving 84 and 85 is not particularly limited. The first and second electrodes for driving 84 and 85 can be formed of a metal material such as gold (Au), a gold alloy, platinum (Pt), aluminum (Al), an aluminum alloy, silver (Ag), a silver alloy, chrome (Cr), a chrome alloy, copper (Cu), molybdenum (Mo), niobium (Nb), tungsten (W), iron (Fe), titanium (Ti), cobalt (Co), zinc (Zn), and zirconium (Zr) and a conductive material such as indium tin oxide (ITO).

Package

As shown in FIGS. 1 and 2, the package 9 includes a box-like base 91 including a recess 911 opened to the upper surface and a plate-like lid 92 joined to the base 91 to close the opening of the recess 911. The package 9 includes a housing space formed by closing the recess 911 with the lid 92. The resonator element 2 is hermetically housed in the housing space. The resonator element 2 is fixed to the bottom surface of the recess 911 at the distal end portions of the supporting arms 74 and 75 via conductive adhesives 11, 12, 13, and 14 obtained by, for example, mixing a conductive filler in epoxy or acrylic resin.

Note that the housing space may be in a decompressed (preferably, vacuum) state or an inert gas such as nitrogen, helium, or argon may be encapsulated in the housing space. Consequently, a resonation characteristic of the resonator element 2 is improved.

A constituent material of the base 91 is not particularly limited. However, various ceramics such as aluminum oxide can be used. A constituent material of the lid 92 is not particularly limited and only has to be a member having a coefficient of linear expansion close to the coefficient of linear expansion of the constituent material of the base 91. For example, when the constituent material of the base 91 is the ceramics explained above, it is preferable that the constituent material of the lid 92 is an alloy of kovar or the like. Note that joining of the base 91 and the lid 92 is not particularly limited. For example, the base 91 and the lid 92 may be joined via an adhesive or may be joined by seam welding or the like.

Connection terminals 951 and 961 are formed on the bottom surface of the recess 911 of the base 91. Although not shown in the figure, the first electrodes for driving 84 of the resonator element 2 are drawn out to the distal end portion of the supporting arm 74 and, in the portion, electrically connected to the connection terminal 951 via the conductive adhesives 11 and 12. Similarly, although not shown in the figure, the second electrodes for driving 85 of the resonator element 2 are drawn out to the distal end portion of the supporting arm 75 and, in the portion, electrically connected to the connection terminal 961 via the conductive adhesives 13 and 14.

The connection terminal 951 is electrically connected to an external terminal 953 formed on the bottom surface of the base 91 via a through-electrode 952 that pierces through the base 91. The connection terminal 961 is electrically connected to an external terminal 963 formed on the bottom surface of the base 91 via a through-electrode 962 that pierces through the base 91.

A constituent material of the connection terminals 951 and 961, the through-electrodes 952 and 962, and the external terminals 953 and 963 is not particularly limited as long as the constituent material has electric conductivity. However, the connection terminals 951 and 961, the through-electrodes 952 and 962, and the external terminals 953 and 963 can be formed of, for example, a metal film obtained by stacking films of Ni (nickel), Au (gold), Ag (silver), Cu (copper), or the like on a metalize layer (a foundation layer) of Cr (chrome), W (tungsten), or the like.

Manufacturing Method for the Resonator Element

A manufacturing method for the resonator element 2 (the resonator 1) applied with a manufacturing method for a resonator element according to the invention is explained with reference to FIGS. 4A to 6B. Note that FIGS. 4A to 6B are respectively sectional views corresponding to a B-B line section in FIG. 1.

The manufacturing method for the resonator element 2 includes a step of preparing a quartz crystal substrate (base material) and forming a mask on the quartz crystal substrate and a step of processing (patterning) the quartz crystal substrate with a dry etching method using the mask and forming the resonator substrate 3 including the base section 4, the resonating arms 5 and 6, and the supporting section 7. The manufacturing method is explained in detail below.

Figure 4A:
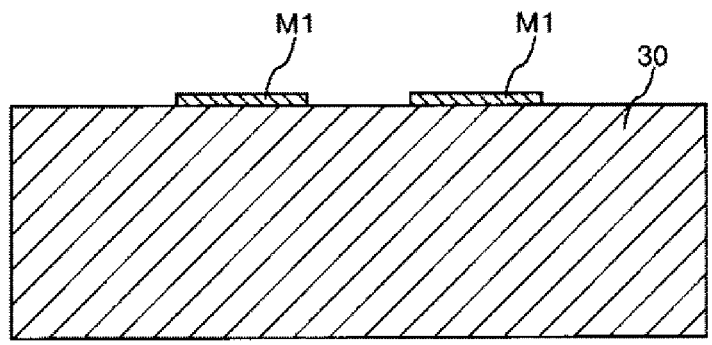
FIGS. 4A to 4D are sectional views for explaining a manufacturing method for the resonator element of the resonator shown in FIG. 1.

[1] First, a Z-cut quartz crystal substrate (base material) 30 is prepared. Thereafter, as shown in FIG. 4A, a mask M1 is formed on the quart substrate 30.

The mask M1 can be formed as explained below using, for example, a photolithography method.

[1-1] First, the Z-cut quartz crystal substrate (base material) 30 is prepared. A foundation layer, which is a seed layer, is formed on the quartz crystal substrate 30.

It is preferable to form the foundation layer (the seed layer) with, for example, a vapor phase film formation method using seed metal such as sputtering or vapor deposition. Consequently, when the mask M1 is formed using a plating method, it is possible to cause the foundation layer including the seed metal to exhibit a function of a seed layer when a constituent material of the mask M1 is stacked on the quartz crystal substrate 30.

A constituent material of the foundation layer is not particularly limited as long as, when the mask M1 is formed, the constituent material urges the formation of the mask M1. Examples of the constituent material include Cr and Cu.

[1-2] Subsequently, a resist layer is formed on the foundation layer using the photolithography method.

The resist layer is a mask that can be patterned into a desired shape to include an opening section corresponding to the external shape of the mask M1 that should be formed. That is, the resist layer is a mask patterned such that the mask M1 can be formed in a part where the resist layer is not formed.

The formation of the resist layer by the photolithography method can be performed by, for example, after applying (supplying) a resist material (a photosensitive photoresist) onto the foundation layer, exposing the resist material to light via a photomask corresponding to the shape of the resist layer and thereafter developing the resist material with developing liquid.

Note that examples of a method of applying the resist material include a spin coat method, a casting method, a micro gravure coat method, a gravure coat method, a bar coat method, a roll coat method, a wire bar coat method, a dip coat method, a spray coat method, a screen printing method, a flexography method, an offset printing method, an inkjet method, and a micro contact printing method. Among these methods, one kind can be used or two or more kinds can be used in combination.

Further, the resist material (the photosensitive photoresist) may be either a negative resist material or a positive resist material.

[1-3] Subsequently, the mask M1 is formed on the foundation layer exposed in the opening section of the resist layer by the plating method.

Note that, the plating method may be either an electrolytic plating method or an electroless plating method. However, the plating method is preferably the electroless plating method. According to the electroless plating method, it is possible to form the mask M1 having excellent film formation accuracy and uniform film thickness without using a large apparatus.

A constituent material of the mask M1 is not particularly limited. However, examples of the constituent material include, besides metal materials such as Ni, Cr, and Si, alloys, nitrides, fluorides, and oxides of the metal materials.

[1-4] Subsequently, the resist layer is removed and the foundation layer in a position corresponding to the resist layer is removed.

Consequently, the patterned mask M1 is obtained on the quartz crystal substrate 30.

The removal of the resist layer can be preferably performed using resist peeling liquid. However, the removal of the resist layer can be performed using physical etching methods such as plasma etching, reactive etching, beam etching, and optical assist etching. The removal of the foundation layer can be performed using the physical etching method. Therefore, the removal of the resist layer and the foundation layer can be carried out by combining these methods as appropriate.

Note that, in this embodiment, the mask M1 is formed using the plating method. However, a method of forming the mask M1 is not limited to this case. For example, after a metallic liquid material is selectively supplied to the opening section included in the resist layer using the inkjet method, the liquid material may be solidified to form the mask M1.

In this case, the formation of the foundation layer in [1-1] may be omitted.

Figure 4B:
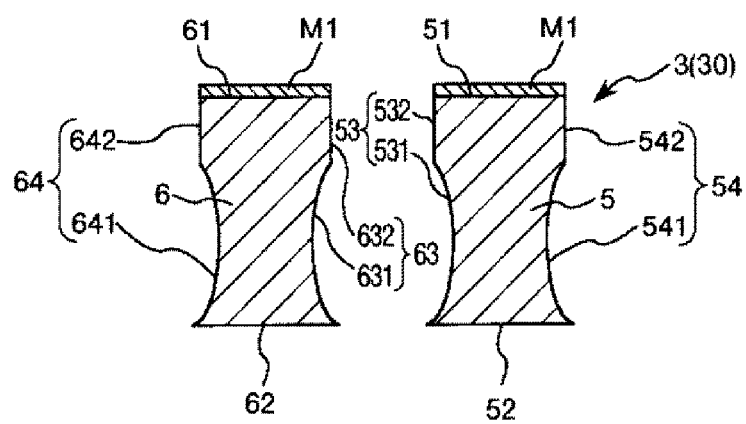

[2] Subsequently, as shown in FIG. 4B, dry etching is applied to the quartz crystal substrate 30 via (using) the mask M1.

Consequently, etching is performed in a direction orthogonal to (crossing) the resonating direction of the resonator element 2. As a result, the base section 4, the resonating arms 5 and 6 in which the grooves 55, 56, 65, and 66 are not formed, and the supporting section 7 are integrally formed (the base section 4 and the supporting section 7 are not shown in the figure).

In the invention, in [2] for obtaining, with the dry etching, the resonator element 2 including the base section 4, the resonating arms 5 and 6, and the supporting section 7, the side surfaces 53, 54, 63, and 64 included in the resonating arms 5 and 6 are respectively formed as side surfaces including the recesses 531, 541, 631, and 641.

The formation of the recesses 531, 541, 631, and 641 on the side surfaces 53, 54, 63, and 64 can be performed using various dry etching methods. Above all, the recesses 531, 541, 631, and 641 are preferably formed by the plasma etching method using a CF-based reactive gas as an etchant. With such a method, when the resonator element 2 is obtained by patterning the quartz crystal substrate 30 using the mask M1 by simply changing conditions of the plasma etching method explained below, the surfaces 53, 54, 63, and 64 to be formed as side surfaces including both of the recesses 531, 541, 631, and 641 and the plane sections 532, 542, 632, and 642.

A method of forming the side surfaces 53, 54, 63, and 64 including the recesses 531, 541, 631, and 641 and the plane sections 532, 542, 632, and 642 with the plasma etching method using the CF-based reactive gas is explained.

[2-1] First, when the quartz crystal substrate 30 is patterned by the plasma etching method using the mask M1, the quartz crystal substrate 30 is etched in the Z'-axis direction (a direction crossing the resonating direction) using an anisotropic plasma component.

Consequently, when the quartz crystal substrate 30 is removed in the Z'-axis direction (the thickness direction), the plane sections 532, 542, 632, and 642 are formed. It is possible to form the plane sections 532, 542, 632, and 642 at excellent dimension accuracy.

The CF-based reactive gas used for the plasma etching method is preferably a mixed gas including the CF-based reactive gas.

Examples of the CF-based gas include $CF_4$, $CHF_3$, $C_2F_6$, $C_4F_8$, and $C_5F_8$. Among these gases, one kind can be used or two or more kinds can be used in combination. Examples of the mixed gas include, besides the CF-based gas, mixed gases including at least one kind among CO, Ar, $O_2$, and $N_2$.

In this case, the CF-based reactive gas (etchant) can be easily changed to an anisotropic plasma component for etching in the Z'-axis direction by appropriately setting at least one kind among etching conditions such as the pressure in a chamber, plasma density, temperature, an etchant (gas type), and bias power.

[2-2] Subsequently, the recesses 531, 541, 631, and 641 are formed by performing etching in both of the X-axis direction (the resonating direction) and the Z'-axis direction (the direction crossing the resonating direction) using an isotropic plasma component.

Consequently, the side surfaces 53, 54, 63, and 64 including the recesses 531, 541, 631, and 641 and the plane sections 532, 542, 632, and 642 are formed.

The formation of the recesses 531, 541, 631, and 641 using the anisotropic plasma component can be performed by, for example, after forming the plane sections 532, 542, 632, and 642 using the anisotropic plasma component, changing this etching condition and increasing the isotropic plasma component. Consequently, it is possible to perform the etching in both of the X-axis direction and the Z'-axis direction. As a result, the recesses 531, 541, 631, and 641 are formed. By patterning the quartz crystal substrate 30 using the isotropic plasma component, it is possible to form the recesses 531, 541, 631, and 641 at excellent dimension accuracy.

In this case, the CF-based reactive gas (etchant) is preferably changed to the isotropic plasma component for performing etching in both of the X-axis direction and the Z'-axis direction by changing at least one kind among the etching conditions such as pressure in the chamber, plasma density, temperature, an etchant (gas type), and bias power. In this way, with relatively easy operation for changing the etching condition, it is possible to change the CF-based reactive gas to the isotropic plasma component.

[1] and [2] above are configured by the manufacturing method for the resonator element according to the invention.

Figure 4C:
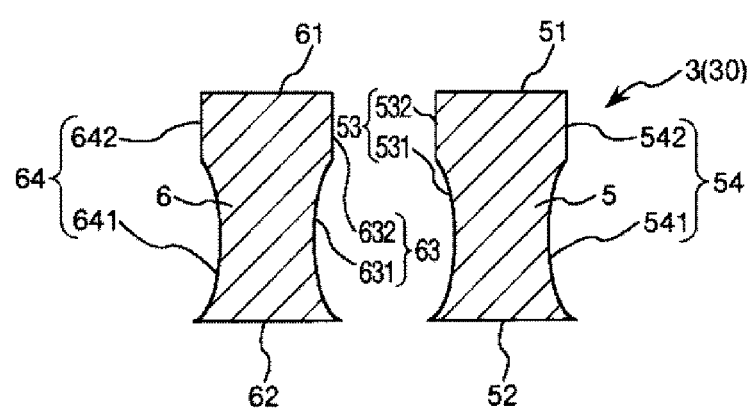

[3] Subsequently, as shown in FIG. 4C, the mask M1 is removed.

The removal of the mask M1 can be performed using physical etching methods such as plasma etching, reactive etching, beam etching, and optical assist etching.

Figure 4D:
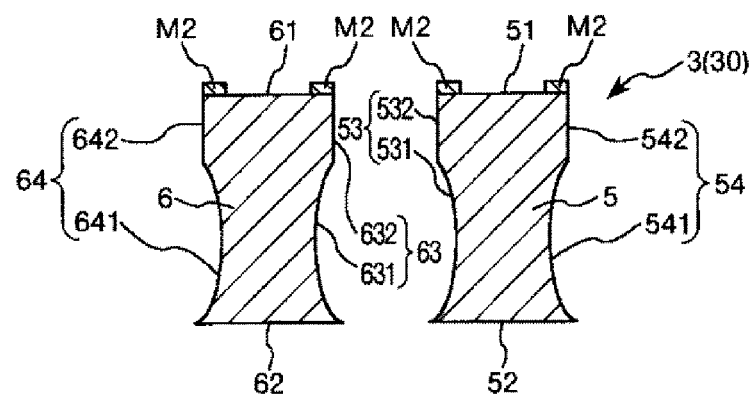

[4] Subsequently, as shown in FIG. 4D, a mask M2 is formed on the quartz crystal substrate 30 using the photolithography.

The mask M2 is a mask formed corresponding to the external shape of the grooves 55 and 65. Note that the mask M2 is formed in apart where the grooves 55 and 65 are not formed. That is, the mask M2 includes an opening corresponding to the external shape of the grooves 55 and 65.

Figure 5A:
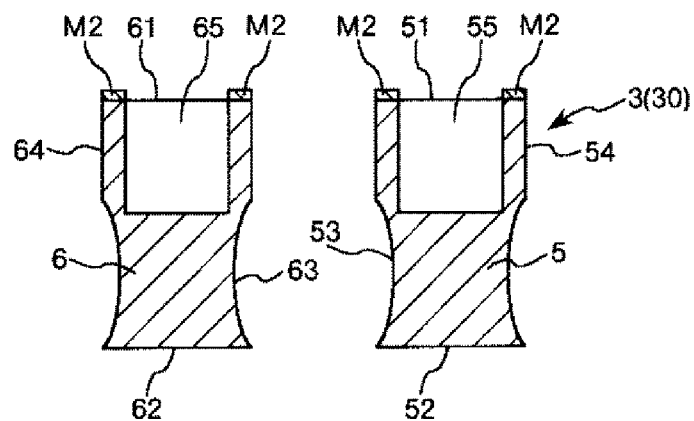
FIGS. 5A to 5C are sectional views for explaining the manufacturing method for the resonator element of the resonator shown in FIG. 1.

[5] Subsequently, as shown in FIG. 5A, anisotropic plasma etching is applied to the quartz crystal substrate 30 via the mask M2. Consequently, the groove 55 is formed in the resonating arm 5 and the groove 65 is formed in the resonating arm 6. The resonator substrate 3 including the resonating arms 5 and 6 in which the grooves 56 and 66 are not formed, the base section 4, and the supporting section 7 is formed.

Note that, in this case, an etching time of the anisotropic plasma etching is controlled to set the maximum depth of the grooves 55 and 65 to a predetermined value.

Figure 5B:
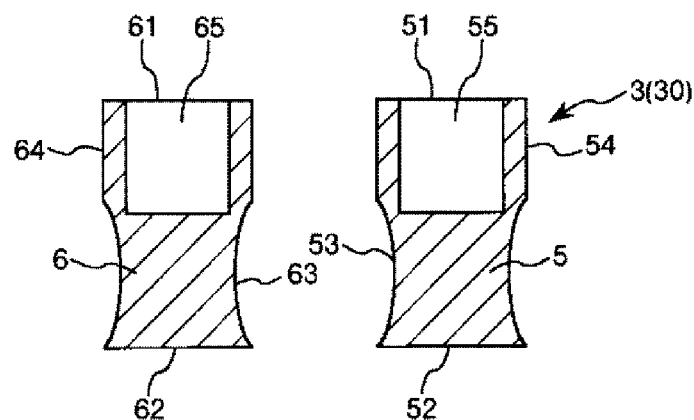

[6] Subsequently, as shown in FIG. 5B, the mask M2 is removed.

Figure 5C:
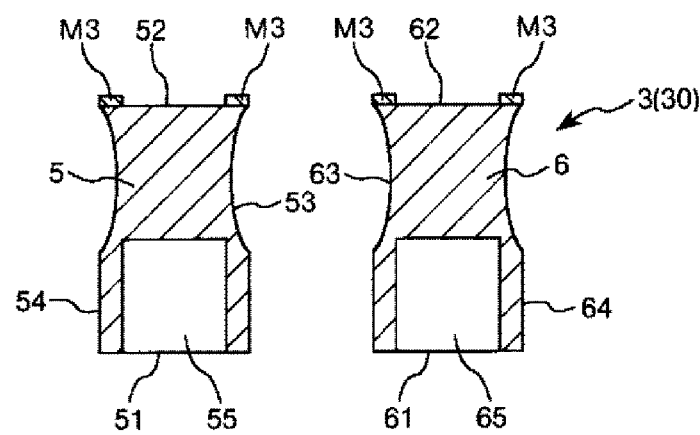

[7] Subsequently, as shown in FIG. 5C, the quartz crystal substrate 30 is vertically reversed and a mask M3 is formed on the quartz crystal substrate 30 using the photolithography method.

The mask M3 is a mask formed corresponding to the external shape of the grooves 56 and 66. Note that the mask M3 is formed in apart where the grooves 56 and 66 are not formed. That is, the mask M3 includes an opening corresponding to the external shape of the grooves 56 and 66.

Figure 6A:
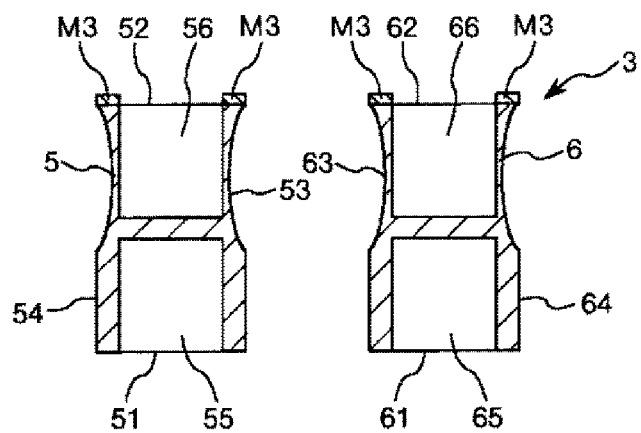
FIGS. 6A and 6B are sectional views for explaining the manufacturing method for the resonator element of the resonator shown in FIG. 1.

[8] Subsequently, as shown in FIG. 6A, the anisotropic plasma etching is applied to the quartz crystal substrate 30 via the mask M3. Consequently, the groove 56 is formed in the resonating arm 5 and the groove 66 is formed in the resonating arm 6. The resonator substrate 3 including the resonating arms 5 and 6 in which the grooves 55, 56, 65, and 66 are formed, the base section 4, and the supporting section 7 is formed. Note that, in this case, an etching time of the anisotropic plasma etching is controlled to set the maximum depth of the grooves 56 and 66 to a predetermined value.

Figure 6B:
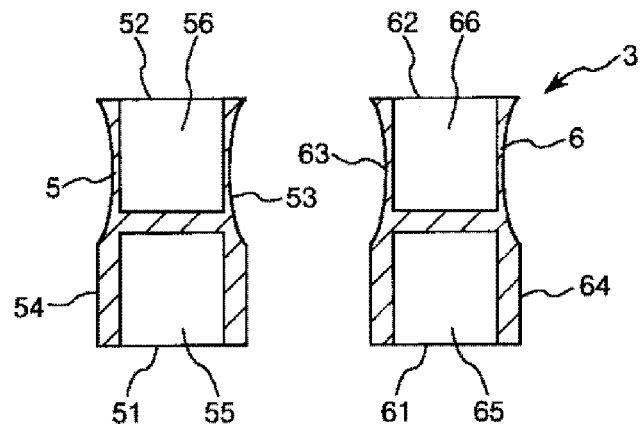

[9] Subsequently, as shown in FIG. 6B, the mask M3 is removed.

The resonator substrate 3 is obtained through the process explained above.

[10] Subsequently, a not-shown metal film is formed on the surface of the resonator substrate 3 by, for example, vapor deposition. Subsequently, the first and second electrodes 84 and 85 for driving are formed by, for example, patterning the metal film via a not-shown mask.

Consequently, the resonator element 2 can be obtained.

Note that, in this embodiment, the side surfaces 53, 54, 63, and 64 include the recesses 531, 541, 631, and 641 and the plane sections 532, 542, 632, and 642. However, the formation of the plane sections 532, 542, 632, and 642 may be omitted. In this case, by omitting [2-1], the side surfaces 53, 54, 63, and 64 are formed in which the plane sections 532, 542, 632, and 642 are not formed.

Second Embodiment

Figure 7:
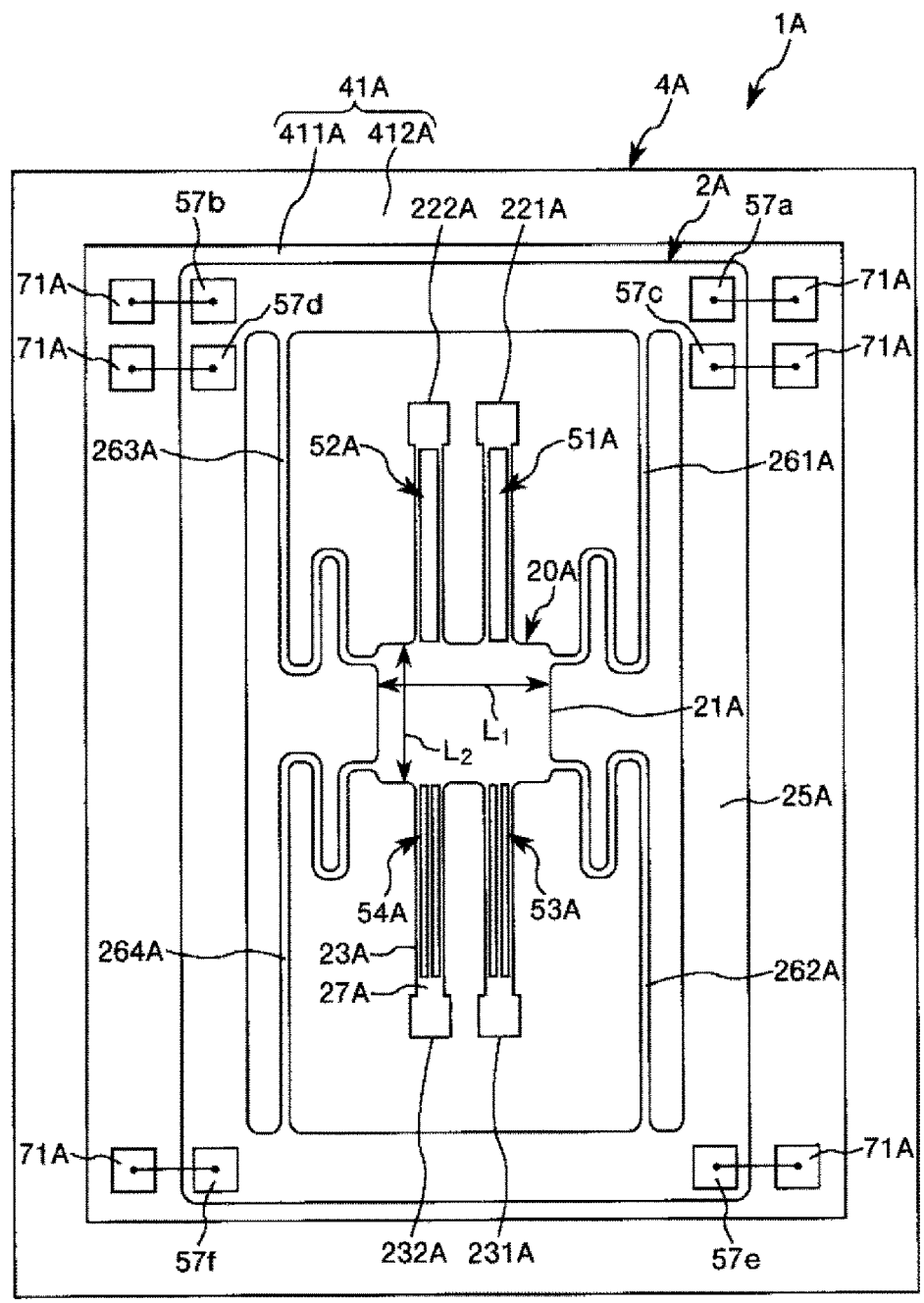
FIG. 7 is a plan view showing a second embodiment of the resonator according to the invention.
Figure 9A:
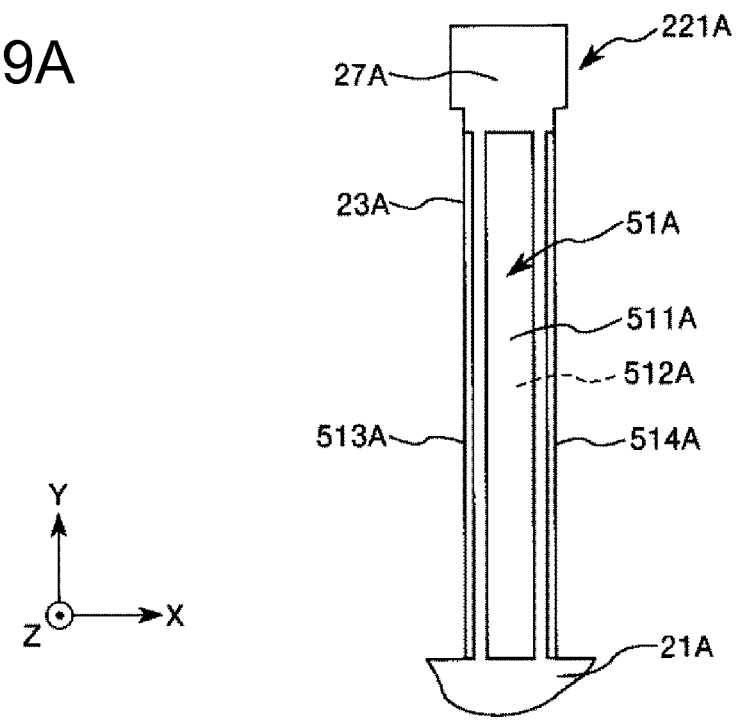
Figure 9B:
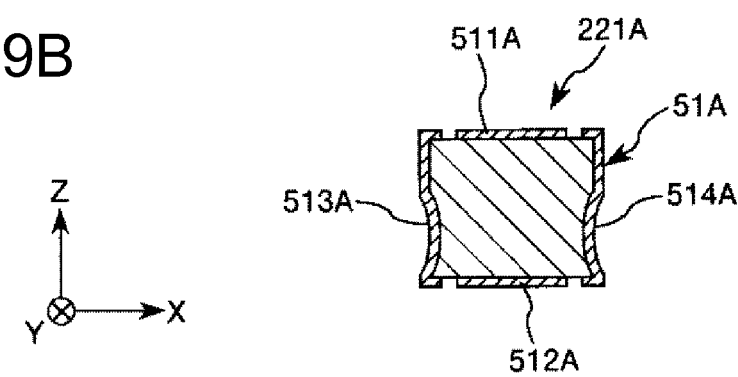
Figure 10A:
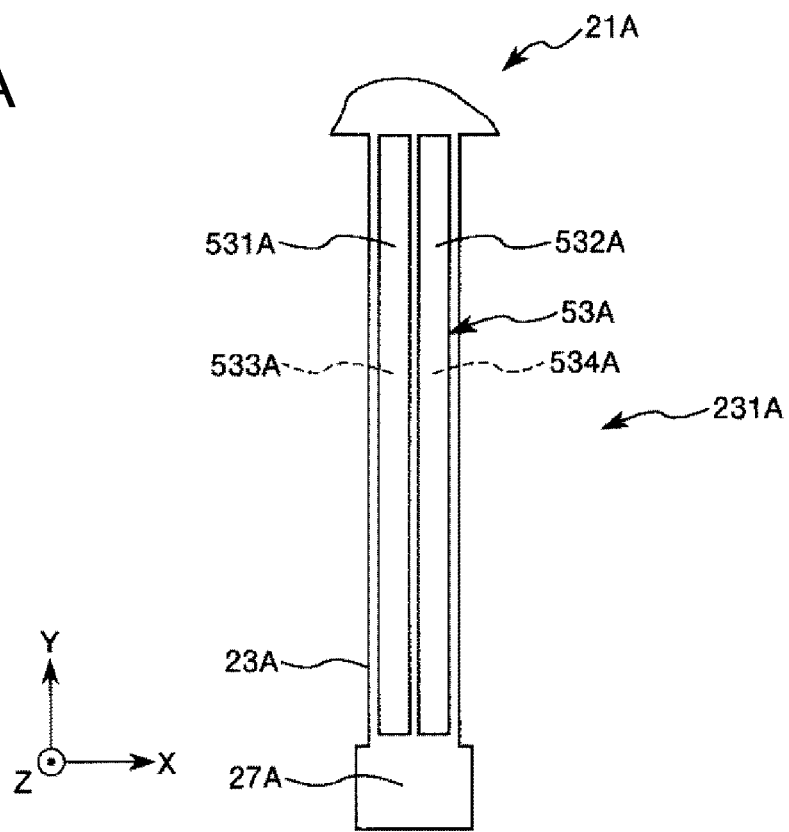
Figure 10B:
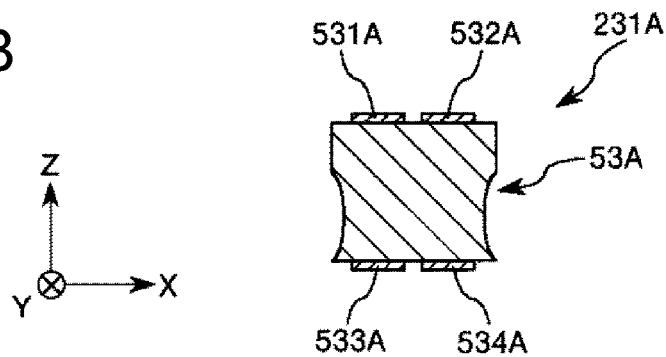
Figure 11:
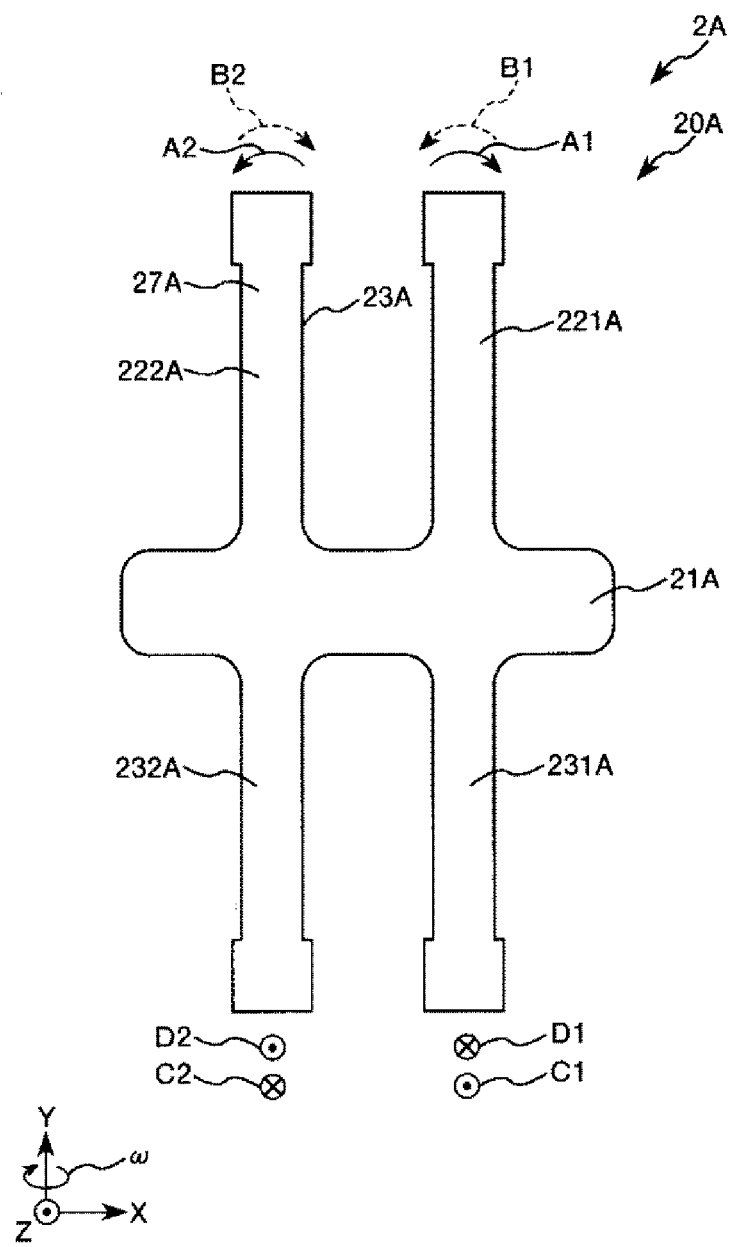
FIG. 11 is a perspective view of a main part of a resonator element of the resonator shown in FIG. 7.
Figure 12:
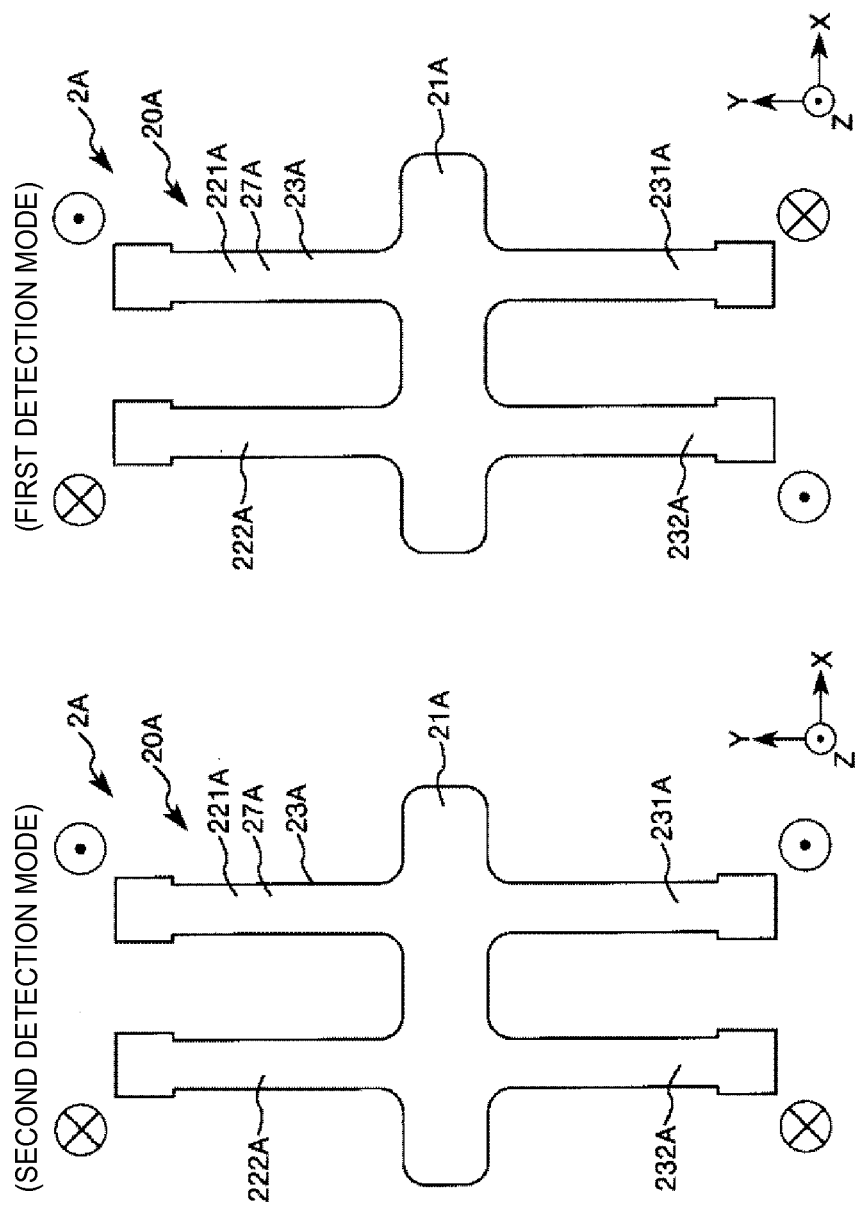
FIGS. 12A and 12B are diagrams for explaining detection modes of the resonator element of the resonator shown in FIG. 7.

FIG. 7 is a plan view showing a second embodiment of the resonator according to the invention. FIG. 8 is a cross sectional view of the resonator shown in FIG. 7. FIGS. 9A and 9B are diagrams showing a resonating arm for driving of the resonator shown in FIG. 7. FIG. 9A is an enlarged plan view and FIG. 9B is an enlarged cross sectional view. FIGS. 10A and 10B are diagrams showing a resonating arm for detection of the resonator shown in FIG. 7. FIG. 10A is an enlarged plan view and FIG. 10B is an enlarged cross sectional view. FIG. 11 is a perspective view of a main part of a resonator element of the resonator shown in FIG. 7. FIGS. 12A and 12B are diagrams for explaining detection modes of the resonator element of the resonator shown in FIG. 7.

Note that, in the following explanation, as three axes orthogonal to (crossing) one another, an x axis (a first axis), a y axis (a first axis), and a z axis (a first axis) are assumed. In FIGS. 7 to 11, the axes are shown. A direction parallel to the x axis is referred to as "x-axis direction", a direction parallel to the y axis is referred to as "y-axis direction", and a direction parallel to the z axis is referred to as "z-axis direction". Plus and minus of the directions are as indicated by arrows in the figures.

In the following explanation, the second embodiment is explained centering on differences from the first embodiment. Explanation of similarities is omitted.

A resonator 1A shown in FIGS. 7 and 8 is a gyro sensor that detects angular velocity.

The resonator 1A can be used for, for example, hand shake correction of an image pickup apparatus and posture detection and posture control of a vehicle in a moving object navigation system that uses a GPS (Global Positioning System) satellite signal.

The resonator 1A includes a resonator element 2A and a package 4A in which the resonator element 2A is housed.

The sections configuring the resonator 1A are explained below in order.

The resonator element 2A is a gyro sensor element that detects angular velocity around one axis.

As shown in FIG. 7, the z axis is the normal of the resonator element 2A. The resonator element 2A includes a resonator substrate 20A, electrode groups for driving 51A and 52A, and electrode groups for detection 53A and 54A.

The resonator substrate 20A is a resonator substrate of a so-called "H type" including a pair of resonating arms for driving (resonating arms) 221A and 222A, a pair of resonating arms for detection (resonating arms) 231A and 232A, a supporting section 25A, and four coupling sections 261A, 262A, 263A, and 264A. In this embodiment, the base section 21A, the resonating arms for driving 221A and 222A, the resonating arms for detection 231A and 232A, the supporting section 25A, and the coupling sections 261A to 264A are integrally formed of a piezoelectric material. Note that the resonating arm for detection 231A is a first resonating arm for detection and the resonating arm for detection 232A is a second resonating arm for detection.

The piezoelectric material is not particularly limited. However, quartz crystal is preferably used. Consequently, characteristics of the resonator element 2A can be improved. The quartz crystal includes three crystal axes, i.e., an X axis (an electric axis), a Y axis (a mechanical axis), and a Z axis (an optical axis) orthogonal to one another. A base section 21A, the resonating arms for driving 221A and 222A, the resonating arms for detection 231A and 232A, the supporting section 25A, and the coupling sections 261A to 264A are formed by, for example, etching a substrate formed of quartz crystal having the Z axis in the thickness direction and having a plate surface parallel to the X axis and the Y axis. The thickness of the substrate is appropriately set according to a resonation frequency (a resonance frequency), an external size, machinability, and the like of the resonator element 2A. Note that, in this embodiment, an example is explained in which the base section 21A, the resonating arms for driving 221A and 222A, the resonating arms for detection 231A and 232A, the supporting section 25A, and the coupling sections 261A to 264A are integrally formed of quartz crystal. In this embodiment, the X axis of the crystal axes coincides with the x axis of absolute coordinate axes, the Y axis of the crystal axes coincides with the y axis of the absolute coordinate axes, and the Z axis of the crystal axes coincides with the z axis of the absolute coordinate axes.

The base section 21A is supported by the supporting section 25A, which is formed to surround the base section 21A in plan view, via the four coupling sections 261A to 264A. The four coupling sections 261A to 264A are respectively formed in long shapes. One ends of the coupling sections 261A to 264A are coupled to the base section 21A. The other ends are coupled to the supporting section 25A. Note that the coupling sections 261A to 264A are bent a plurality of times halfway in the longitudinal direction.

When viewed from the z-axis direction, the base section 21A is formed in a rectangular shape having a pair of sides extending in the y-axis direction and a pair of sides extending in the x-axis direction. That is, in plan view, the base section 21A is formed in a rectangular shape having a pair of sides parallel to an extending direction of the resonating arms for driving 221A and 222A and a pair of sides perpendicular to the extending direction of the resonating arms for driving 221A and 222A. Consequently, it is possible to more efficiently cause the resonating arms for detection 231A and 232A to oscillate in a second direction (a direction of x-axis shown in FIG. 11) (in-plane resonation) according to driving resonation of the resonating arms for driving 221A and 222A as explained below (see FIG. 11).

As shown in FIG. 7, the base section 21A in this embodiment is formed in a square shape. The length in the x-axis direction of the base section 21A is preferably larger than the length in the y-axis direction. That is, when the length of the base section 21A in a direction perpendicular to the extending direction of the resonating arms for driving 221A and 222A in plan view is represented as $L_1$ and the length of the base section 21A in a direction parallel to the extending direction of the resonating arms for driving 221A and 222A in plan view is represented as $L_2$, a relation $L_1 > L_2$ is preferably satisfied. By satisfying the relation between $L_1$ and $L_2$, it is possible to more efficiently cause the resonating arms for detection 231A and 232A to oscillate in the second direction E1 and E2 according to the driving resonation of the resonating arms for driving 221A and 222A.

The resonating arms for driving 221A and 222A extend from the base section 21A in the y-axis direction (the +y direction). Consequently, the resonating arms for driving 221A and 222A are provided to be parallel to each other. The resonating arms for driving 221A and 222A are disposed to be separated from each other in the x-axis direction. Consequently, the resonating arms for driving 221A and 222A can oscillate independently from each other. As shown in FIG. 9B, each of the cross sections of the resonating arms for driving 221A and 222A is formed in a rectangular shape formed by a pair of sides parallel to the x axis and a pair of sides parallel to the z axis.

In the resonating arm for driving 221A, the electrode group for driving 51A is provided. Similarly, in the resonating arm for driving 222A, the electrode group for driving 52A is provided. The electrode group for driving 51A is representatively explained below. Note that the electrode group for driving 52A is configured by four electrodes for driving and is the same as the electrode group for driving 51A explained below. Therefore, explanation of the electrode group for driving 52A is omitted. Note that predetermined electrodes of the electrode group for driving 51A and the electrode group for driving 52A are electrically connected to each other via a not-shown wire.

As shown in FIGS. 9A and 9B, the electrode group for driving 51A is configured by an electrode for driving 511A provided on the upper surface of the resonating arm for driving 221A, an electrode for driving 512A provided on the lower surface of the resonating arm for driving 221A, an electrode for driving 513A provided on the left side surface of the resonating arm for driving 221A, and an electrode for driving 514A provided on the right side surface of the resonating arm for driving 221A.

The electrode for driving 511A and the electrode for driving 512A are electrically connected to each other via a not-shown wire to have the same potential each other. The electrode for driving 513A and the electrode for driving 514A are electrically connected to each other via a not-shown wire to have the same potential each other. The electrodes for driving 511A and 512A are electrically connected to a terminal 57a provided in the supporting section 25A shown in FIG. 7 via not-shown wires. The electrodes for driving 513A and 514A are electrically connected to a terminal 57b provided in the supporting section 25A shown in FIG. 7. Note that electrodes for driving 521A and 522A of the electrode group for driving 52A are electrically connected to the electrodes for driving 513A and 514A. Electrodes for driving 523A and 524A of the electrode group for driving 52A are electrically connected to the electrodes for driving 511A and 512A.

The resonating arms for detection 231A and 232A extend from the base section 21A in the y-axis direction (the −y direction). Consequently, the resonating arms for detection 231A and 232A are provided to be parallel to each other. The resonating arms for detection 231A and 232A extend in the opposite direction of the extending direction of the resonating arms for driving 221A and 222A. The resonating arms for detection 231A and 232A are disposed to be separated from each other in the x-axis direction. Consequently, the resonating arms for detection 231A and 232A can oscillate independently from each other. As shown in FIG. 10B, each of the cross sections of the resonating arms for detection 231A and 232A is formed in a rectangular shape configured by a pair of sides parallel to the x axis and a pair of sides parallel to the z axis. Note that the resonating arm for detection 231A and the resonating arm for driving 221A are disposed on the same axis. The positions of the resonating arm for detection 231A and the resonating arm for driving 221A in the x-axis direction and the z-axis direction coincide with each other. Similarly, the resonating arm for detection 232A and the resonating arm for driving 222A are disposed on the same axis. The positions of the resonating arm for detection 232A and the resonating arm for driving 222A in the x-axis direction and the z-axis direction coincide with each other.

The resonating arms for detection 231A and 232A respectively oscillate in the first direction (direction C1 and D1 and C2 and D2 shown in FIG. 11) according to physical quantities applied to the resonating arms for driving 221A and 222A as explained below and oscillate in the second direction (the x-axis direction shown in FIG. 11) different from the first direction according to the driving resonation of the resonating arms for driving 221A and 222A.

As shown in FIG. 7, the electrode group for detection 53A is provided in the resonating arm for detection 231A. Similarly, the electrode group for detection 54A is provided in the resonating arm for detection 232A. Since the electrode groups for detection 53A and 54A are provided in the resonating arms for detection 231A and 232A provided separately from the resonating arms for driving 221A and 222A in this way, it is possible to increase an electrode area (an area of portions functioning as electrodes) of electrodes for detection of the electrode groups for detection 53A and 54A. Therefore, it is possible to improve detection sensitivity of the resonator element 2A.

The electrode group for detection 53A is representatively explained below. Note that the electrode group for detection 54A is configured by four electrodes for detection. The electrode group for detection 54A is the same as the electrode group for detection 53A explained below. Therefore, explanation of the electrode group for detection 54A is omitted.

As shown in FIGS. 10A and 10B, the electrode group for detection 53A is configured by electrodes for detection (first electrodes for detection) 531A and 532A provided on the upper surface of the resonating arm for detection 231A and electrodes for detection (first electrodes for detection) 533A and 534A provided on the lower surface of the resonating arm for detection 231A. The electrodes for detection 531A and 533A are provided on one side (the left side in FIGS. 10A and 10B) in the width direction of the resonating arm for detection 231A. The electrodes for detection 532A and 534A are provided on the other side (the right side in FIGS. 10A and 10B) in the width direction of the resonating arm for detection 231A.

The electrode for detection 531A and the electrode for detection 534A are electrically connected to each other via a not-shown wire to have the same potential each other. The electrode for detection 532A and the electrode for detection 533A are electrically connected to each other via a not-shown wire to have the same potential each other. The electrodes for detection 531A and 534A are electrically connected to a terminal 57c provided in the supporting section 25A shown in FIG. 7 via not-shown wires. The electrodes for detection 532A and 533A are electrically connected to a terminal 57e provided in the supporting section 25A shown in FIG. 7 via not-shown wires. Note that the electrode group for detection 54A is electrically connected to terminals 57d and 57f provided in the supporting section 25A shown in FIG. 7 via not-shown wires.

In the resonator element 2A configured in this way, during use, when a driving signal (a driving voltage) is applied between the terminal 57a and the terminal 57b, that is, the electrode groups for driving 51A and 52A are energized, as shown in FIG. 11, the resonating arm for driving 221A and the resonating arm for driving 222A perform bending resonation (driving resonation) (reciprocating driving in the x-axis direction) to approach and separate from each other. That is, the resonating arm for driving 221A and the resonating arm for driving 222A alternately repeat a state in which the resonating arm for driving 221A bends in a direction of an arrow A1 in FIG. 11 and the resonating arm for driving 222A bends in a direction of an arrow A2 in FIG. 11 and a state in which the resonating arm for driving 221A bends in a direction of an arrow B1 in FIG. 11 and the resonating arm for driving 222A bends in a direction of an arrow B2 in FIG. 11. This state in a driving mode.

In a state in which the resonating arms for driving 221A and 222A are driven to oscillate, when angular velocity ω around the y axis is applied to the resonator element 2A, the resonating arms for driving 221A and 222A perform bending resonation to opposite sides each other in the z-axis direction (reciprocating driving in the z-axis direction) with a Coriolis force. According to the bending resonation, the resonating arms for detection 231A and 232A perform bending resonation (detection resonation) to opposite sides each other in the z-axis direction (the first direction) (reciprocating driving in the z-axis direction). That is, the resonating arms for driving 221A and 222A and the resonating arms for detection 231A and 232A repeat a state in which the resonating arm for driving 221A bends in a direction of the C1 direction in FIG. 11 and the resonating arm for driving 222A bends in a direction of the C2 direction in FIG. 11 and a state in which the resonating arm for detection 231A bends in a direction of the D1 direction or the D2 direction in FIG. 11 and the resonating arm for detection 232A bends in a direction of the D2 or D1 in FIG. 11. This state is a detection mode.

By detecting charges generated in the electrode groups for detection 53A and 54A by the detection resonation of the resonating arms for detection 231A and 232A, it is possible to calculate the angular velocity ω applied to the resonator element 2A.

As the detection mode, there is a first detection mode shown in FIG. 12A and a second detection mode shown in FIG. 12B. In the first detection mode and the second detection mode, resonance frequencies of the detection resonation of the resonating arms for detection 231A and 232A are different from each other.

In the first detection mode shown in FIG. 12A, the resonating arms for driving 221A and the resonating arm for detection 231A disposed on the same axis oscillate to opposite sides each other in the z-axis direction. Similarly, the resonating arm for driving 222A and the resonating arm for detection 232A disposed on the same axis oscillate to opposite side each other in the z-axis direction.

In the second detection mode shown in FIG. 12B, the resonating arm for driving 221A and the resonating arm for detection 231A disposed on the same axis oscillate to the same side each other in the z-axis direction. Similarly, the resonating arm for driving 222A and the resonating arm for detection 232A disposed on the same axis oscillate to the same side each other in the z-axis direction.

Note that signs "·" and "x" in FIGS. 12A and 12B respectively indicate directions of displacement in the resonations of the resonating arms for driving 221A and 222A and the resonating arms for detection 231A and 232A corresponding to the signs. The sign "·" indicates that the direction of the displacement is from the back side to the front side of FIGS. 12A and 12B. The sign "x" indicates that the direction of the displacement is from the front side to the back side in FIGS. 12A and 12B.

In the resonator element 2A explained above, the pair of resonating arms for driving (the resonating arms) 221A and 222A and the pair of resonating arms for detection (the resonating arms) 231A and 232A respectively include the recesses on both of the left side surfaces and the right side surfaces of the resonating arms. Consequently, it is possible to increase the surface areas of the left side surfaces and the right side surfaces. Therefore, improvement of electric field efficiency in the resonating arms for driving (the resonating arms) 221A and 222A, which perform the in-plane resonation, is attained. In the resonating arms for driving (the resonating arms) 221A and 222A, it is possible to reduce a thermoelastic loss and secure a satisfactory Q value. Consequently, even if the resonator element 2A is reduced in size, it is possible to obtain sufficient electric field efficiency and secure satisfactory element characteristics. It is possible to obtain effects same as the effects of the first embodiment.

As shown in FIG. 8, the package 4A includes a base member (a base) 41A including a recess opened upward and a lid member (a lid) 42A provided to cover the recess of the base member 41A. An internal space in which the resonator element 2A is housed is formed by the base member 41A and the lid member 42A.

The base member 41A is configured by a flat plate body (plate section) 411A and a frame body (a frame section) 412A joined to the outer circumferential section of the upper surface of the plate body 411A.

The base member 41A is formed of, for example, an aluminum oxide-based sintered compact, quartz crystal, or glass.

As shown in FIG. 8, the supporting section 25A of the resonator element 2A is jointed to the upper surface (a surface on a side covered by the lid member 42A) of the plate body 411A of the base member 41A by a joining member 81A like an adhesive including, for example, silicon resin, epoxy resin, or acrylic resin. Consequently, the resonator element 2A is supported by and fixed to the base member 41A.

Further, as shown in FIGS. 7 and 8, a plurality of internal terminals 71A are provided on the upper surface of the base member 41A.

The terminals 57a to 57f of the resonator element 2A are electrically connected to the plurality of internal terminals 71A via, for example, a wire configured by a bonding wire.

On the other hand, a plurality of external terminals 73A used when the resonator 1A is mounted on a device (an external device), in which the resonator 1A is incorporated, are provided on the lower surface of the plate body 411A of the base member 41A (the bottom surface of the package 4A).

The plurality of external terminals 73A are electrically connected to the plate body 411A via a not-shown internal wire. Consequently, the plate body 411A and the plurality of external terminals 73A are electrically connected.

The internal terminals 71A and the external terminals 73A are respectively formed of, for example, metal films obtained by stacking a film of nickel (Ni), gold (Au), or the like on a metalize layer of tungsten (W) or the like by plating.

The lid member 42A is hermetically joined to the base member 41A. Consequently, the package 4A is hermetically sealed.

The lid member 42A is formed of, for example, a material same as the material of the base member 41A or metal such as kovar, 42 alloy, or stainless steel.

A joining method for the base member 41A and the lid member 42A is not particularly limited. For example, joining methods by adhesives formed of a brazing material, hardening resin, and the like and welding methods such as seam welding and laser welding can be used. By performing such joining under decompression or under an inert gas atmosphere, it is possible to keep the inside of the package 4A in a decompressed state or an inert gas encapsulated state.

With the resonator 1A, effects same as the effects of the first embodiment are obtained.

Third Embodiment

Figure 13:
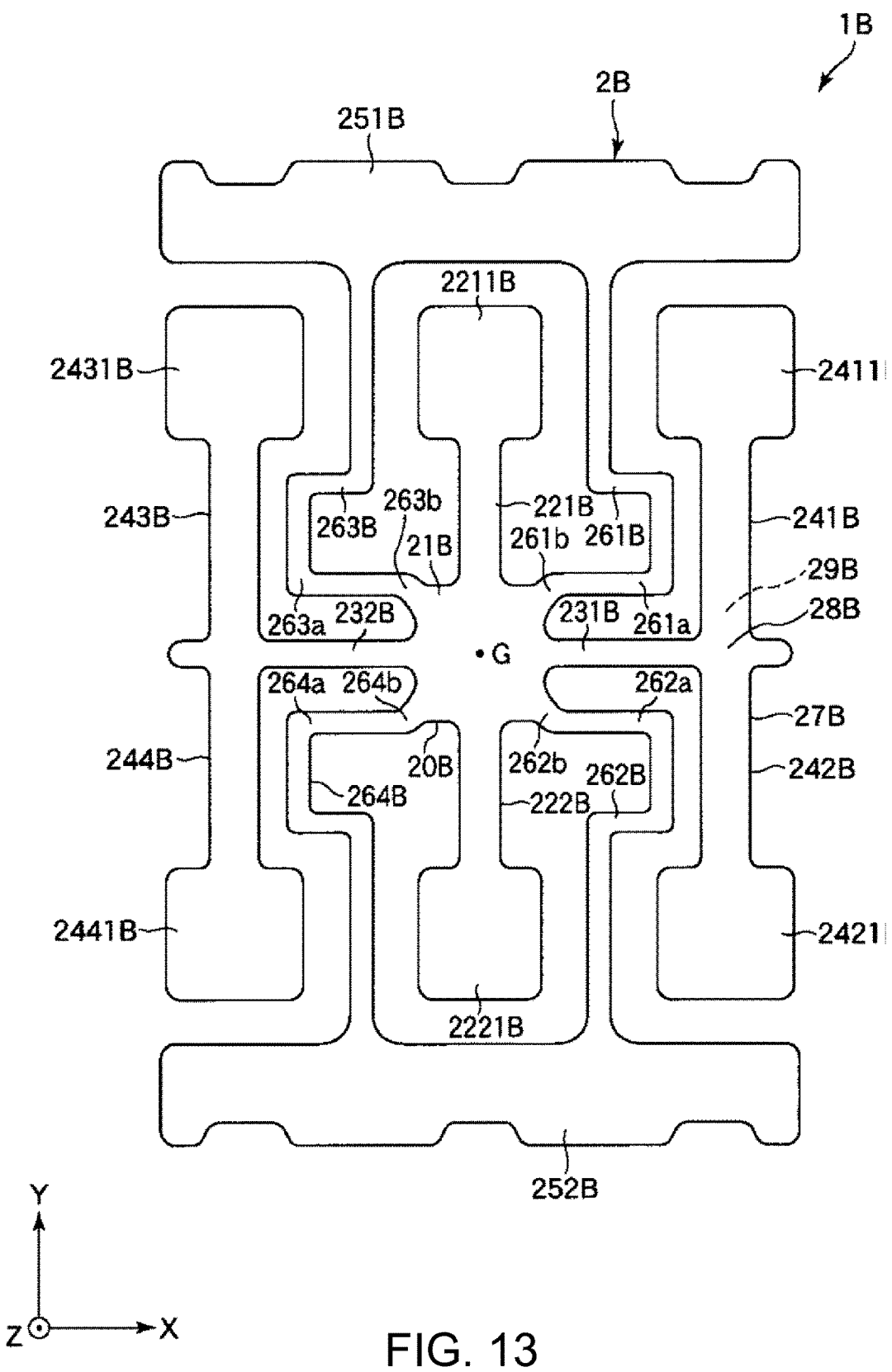
FIG. 13 is a plan view showing a resonator element in a third embodiment of the resonator according to the invention.
Figure 14:
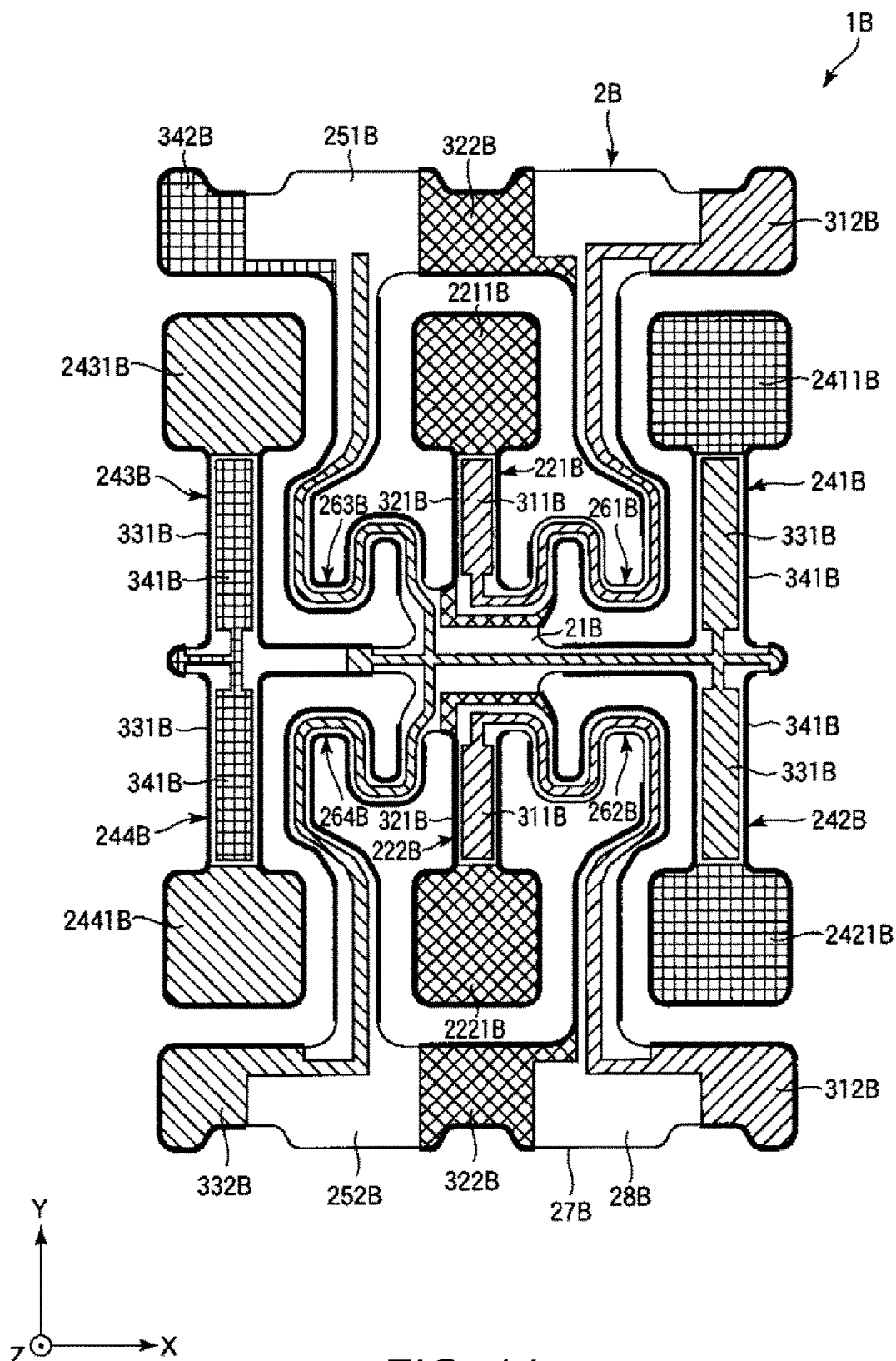
FIG. 14 is a plan view showing electrodes of the resonator element shown in FIG. 13.
Figure 15:
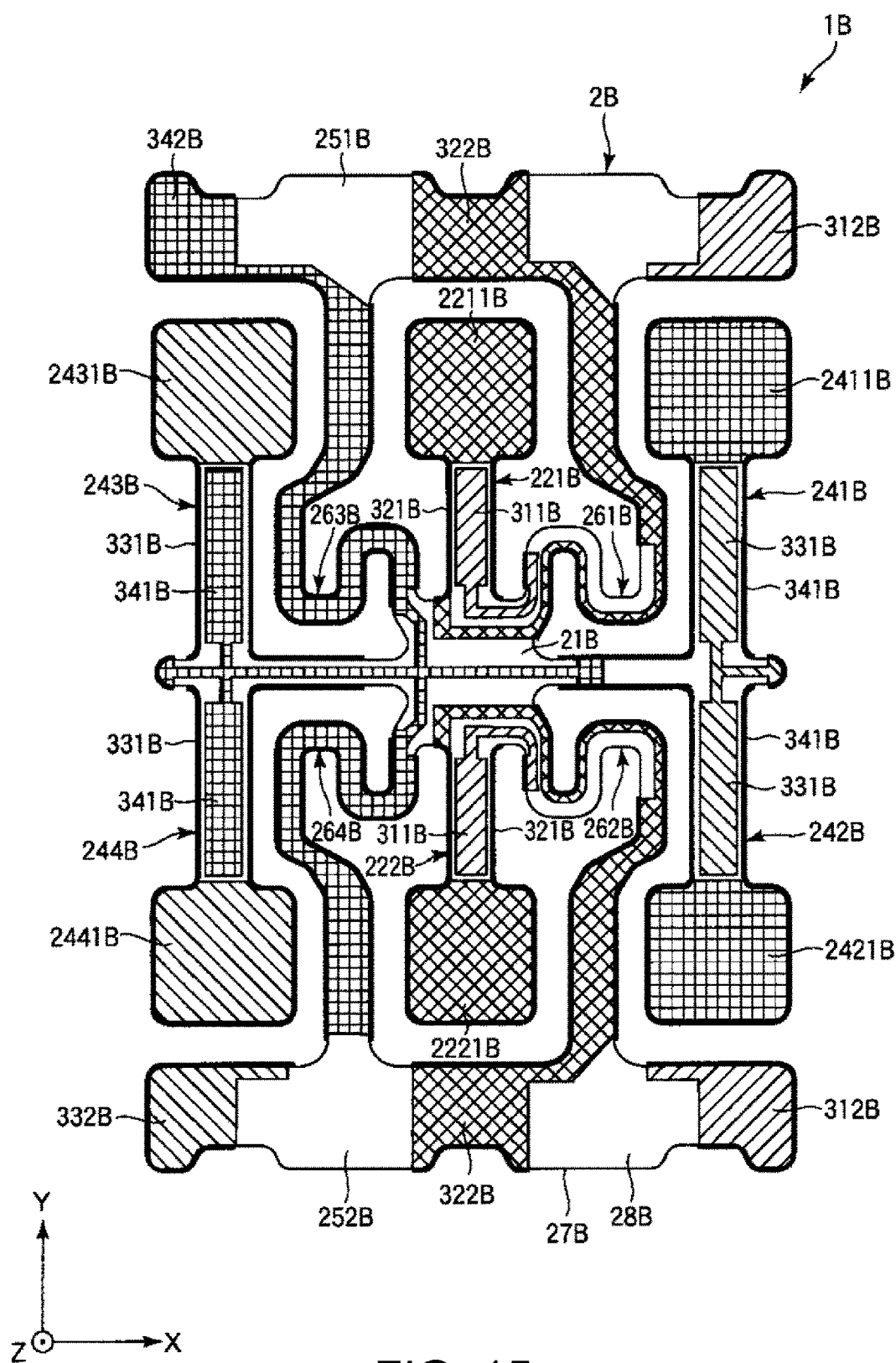
FIG. 15 is a plan view (a see-through view) showing the electrodes of the resonator element shown in FIG. 13.
Figure 16A:
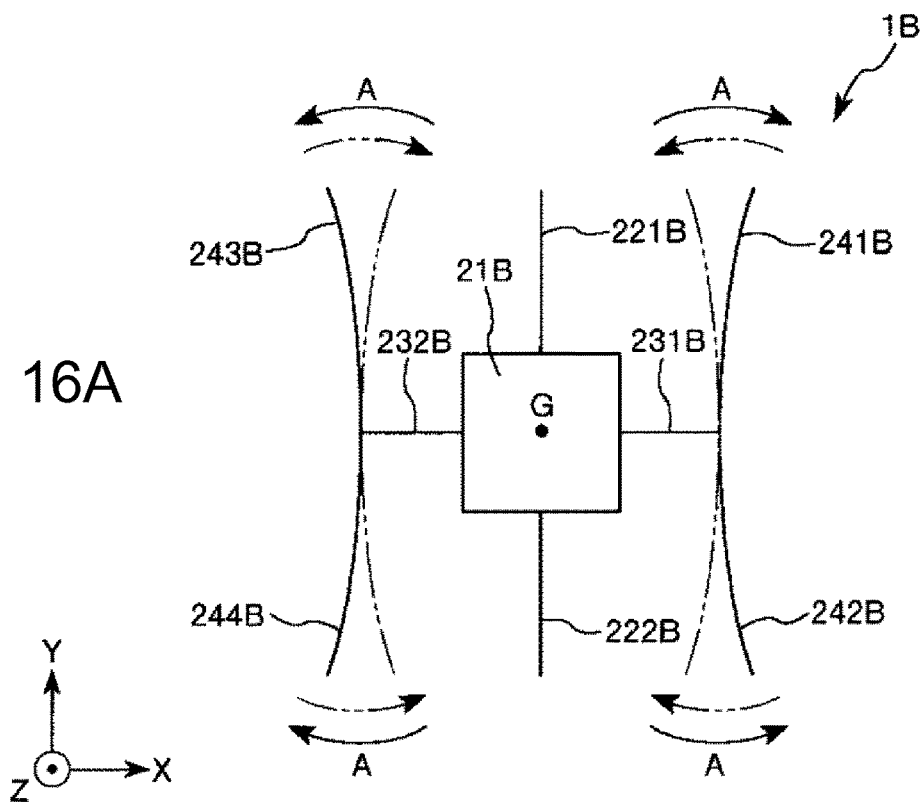
FIGS. 16A and 16B are diagrams for explaining the operation of the resonator element shown in FIG. 13.
Figure 16B:
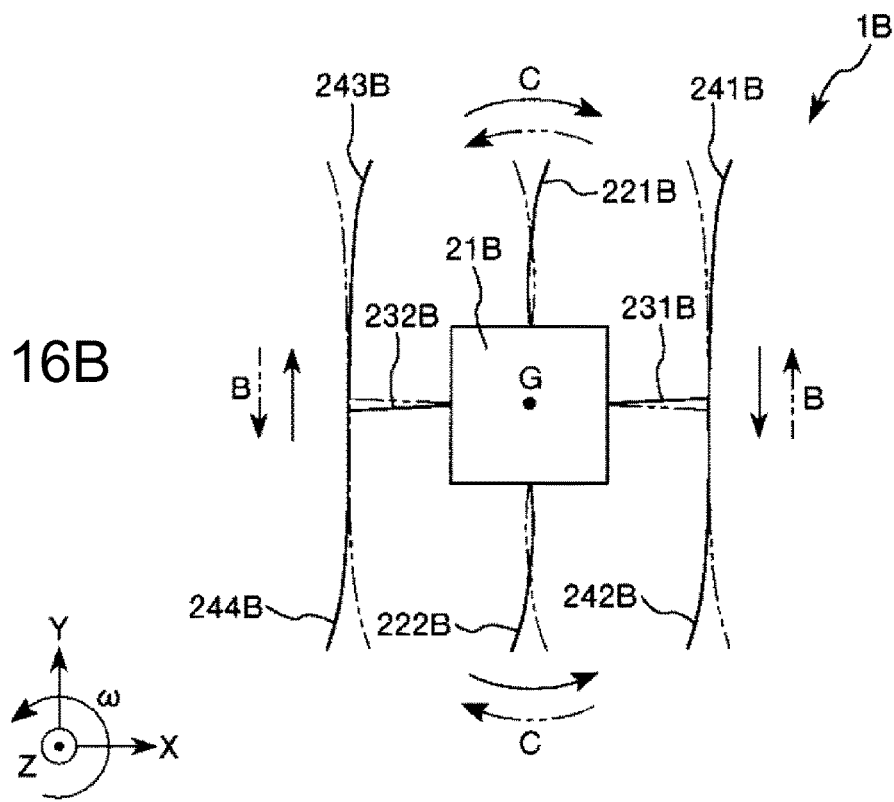

FIG. 13 is a plan view showing a resonator element in a third embodiment according to the resonator of the invention. FIG. 14 is a plan view showing electrodes of the resonator element shown in FIG. 13. FIG. 15 is a plan view (a see-through view) showing the electrodes of the resonator element shown in FIG. 13. FIGS. 16A and 16B are diagrams for explaining the operation of the resonator element shown in FIG. 13.

Note that, in the following explanation, for convenience of explanation, the paper surface front side of FIGS. 13 and 14 is also referred to as "upper side" and the paper surface depth side is also referred to as "lower side". In FIGS. 13, 14, and 6, for convenience of explanation, illustration of electrodes is omitted.

The third embodiment is explained below centering on differences from the first and second embodiments. Explanation of similarities is omitted.

Basic Structure of a Resonator Element

A resonator includes a resonator element 1B shown in FIG. 13 and a package (not shown in the figure) in which the resonator element 1B is housed.

As shown in FIG. 13, the resonator element 1B is used as an angular velocity detecting element (a gyro element). The resonator element 1B includes a resonator substrate (a structure) 2B and electrodes formed on the surface of the resonator substrate 2B.

Resonator Substrate

Examples of a constituent material of the resonator substrate 2B include piezoelectric materials such as quartz crystal, lithium tantalate, and lithium niobate. Among these piezoelectric materials, quartz crystal is preferably used as the constituent material of the resonator substrate 2B. By using quartz crystal, the resonator element 1B having an excellent frequency temperature characteristic compared with the other materials is obtained. Note that, in the following explanation, the resonator substrate 2B is formed of quartz crystal.

As shown in FIG. 13, the resonator substrate 2B is formed in a plate shape spreading on an XY plane defined by a Y axis (a mechanical axis; a second axis) and an X axis (an electric axis; a first axis), which are crystal axes of a quartz crystal substrate, and having thickness in a Z-axis (optical-axis) direction. That is, the resonator substrate 2B is formed of a Z-cut quartz crystal plate. Note that the Z axis preferably coincide with the thickness direction of the resonator substrate 2B. However, from the viewpoint of reducing a frequency temperature change near the normal temperature, the Z axis may be tilted slightly (e.g., about less than 15°) with respect to the thickness direction.

The resonator substrate 2B includes a resonating section 20B, first and second supporting sections 251B and 252B disposed to be opposed to each other in the Y-axis direction via the resonating section 20B, first and third beams (hanging arms) 261B and 263B that couple the first supporting section 251B and the resonating section 20B, and second and fourth beams (hanging arms) 262B and 264B that couple a second sporting section 252B and the resonating section 20B.

The resonating section 20B includes a base section 21B located in the center, a first detection arm (a resonating arm) 221B and a second detection arm (a resonating arm) 222B extending from the base section 21B to both sides in the Y-axis direction, first and second coupling arms (supporting arms) 231B and 232B extending from the base section 21B to both sides in the X-axis direction, a first driving arm (a resonating arm) 241B and a second driving arm (a driving arm) 242B extending from the distal end portion of the first coupling arm 231B to both sides in the +Y-axis direction, and a third driving arm (a resonating arm) 243B and a fourth driving arm (a resonating arm) 244B extending from the distal end portion of the second coupling arm 232B to both sides in the −Y-axis direction. The base section 21B is supported on the first and second supporting sections 251B and 252B by the beams 261B, 262B, 263B, and 264B. Note that a base is configured by the base section 21B and the first and second coupling arms (supporting arms) 231B and 232B. The resonator substrate 2B having such a configuration is a resonator substrate of a so-called "WT type".

The first detection arm 221B extends from the base section 21B in the +Y-axis direction. A wide hammerhead 2211B is provided at the distal end portion of the first detection arm 221B. On the other hand, the second detection arm 222B extends from the base section 21B in the −Y-axis direction. A wide hammerhead 2221B is provided at the distal end portion of the second detection arm 222B. The first and second detection arms 221B and 222B are disposed surface-symmetrically with respect to an XZ plane that passes the center of gravity G of the resonator element 1B.

Since the hammerheads 2211B and 2221B are provided in the first and second detection arms 221B and 222B, detection sensitivity of angular velocity is improved. The length of the first and second detection arms 221B and 222B can be reduced. Note that the hammerheads 2211B and 2221B only have to be provided according to necessity or may be omitted. Bottomed grooves extending in the length direction of the first and second detection arms 221B and 222B may be formed on the upper surfaces and the lower surfaces of the first and second detection arms 221B and 222B according to necessity.

The first coupling arm 231B extends from the base section 21B in the +X-axis direction. On the other hand, the second coupling arm 232B extends from the base section 21B in the −X-axis direction. The first and second coupling arms 231B and 232B are disposed surface-symmetrically with respect to a YZ plane that passes the center of gravity G. Note that bottomed grooves extending in the length direction (the X-axis direction) of the first and second coupling arms 231B and 232B may be provided on the upper surfaces and the lower surfaces of the first and second coupling arms 231B and 232B.

The first driving arm 241B extends from the distal end portion of the first coupling arm 231B in the +Y-axis direction. A wide hammerhead 2411B is provided at the distal end portion. The second driving arm 242B extends from the distal end portion of the first coupling arm 231B in the −Y-axis direction. A wide hammerhead 2421B is provided at the distal end portion. The third driving arm 243B extends from the distal end portion of the second coupling arm 232B in the +Y-axis direction. A wide hammerhead 2431B is provided at the distal end portion. The fourth driving arm 244B extends from the distal end portion of the second coupling arm 232B in the −Y-axis direction. A wide hammerhead 2441B is provided at the distal end portion. The four driving arms 241B, 242B, 243B, and 244B are disposed point-symmetrically with respect to the center of gravity G.

Since the hammerheads 2411B, 2421B, 2431B, and 2441B are provided in the driving arms 241B, 242B, 243B, and 244B, detection sensitivity of angular velocity is improved. The length of the driving arms 241B, 242B, 243B, and 244B can be reduced. Note that the hammerheads 2411B, 2421B, 2431B, and 2441B only have to be provided according to necessity or may be omitted. Bottomed grooves extending in the length direction may be formed on the upper surfaces and the lower surfaces of the driving arms 241B, 242B, 243B, and 244B according to necessity.

The first supporting section 251B is located on the +Y-axis direction side with respect to the base section 21B and disposed to extend in the X-axis direction. On the other hand, the second supporting section 252B is located on the-Y-axis direction side with respect to the base section 21B and disposed to extend in the X-axis direction. The first and second supporting sections 251B and 252B are disposed surface-symmetrically with respect to the XZ plane that passes the center of gravity G.

The first beam 261B passes between the first detection arm 221B and the first driving arm 241B and couples the base section 21B and the first supporting section 251B. The second beam 262B passes between the second detection arm 222B and the second driving arm 242B and couples the base section 21B and the second supporting section 252B. The third beam 263B passes between the first detection arm 221B and the third driving arm 243B and couples the base section 21B and the first supporting section 251B. The fourth beam 264B passes between the second detection arm 222B and the fourth driving arm 244B and couples the base section 21B and the second supporting section 252B. The beams 261B, 262B, 263B, and 264B are disposed point-symmetrically with respect to the center of gravity G.

As shown in FIG. 13, the first beam 261B includes a meandering section 261a coupled to the first supporting section 251B and an inclining section 261b that couples the meandering section 261a and the base section 21B. The second beam 262B includes a meandering section 262a coupled to the second supporting section 252B and an inclining section 262b that couples the meandering section 262a and the base section 21B. The third beam 263B includes a meandering section 263a coupled to the first supporting section 251B and an inclining section 263b that couples the meandering section 263a and the base section 21B. The fourth beam 264B includes a meandering section 264a coupled to the second supporting section 252B and an inclining section 264b that couples the meandering section 264a and the base section 21B.

Electrodes

Electrodes are formed on the surface of the resonator substrate 2B.

As shown in FIGS. 14 and 15, the electrodes include detection signal electrodes 311B, detection signal terminals 312B, detection ground electrodes 321B, detection ground terminals 322B, driving signal electrodes 331B, a driving signal terminal 332B, driving ground electrodes 341B, and a driving ground terminal 342B. Note that, in FIGS. 14 and 15, for convenience of explanation, the detection signal electrodes 311B and the detection signal terminals 312B, the detection ground electrodes 321B and the detection ground terminals 322B, the driving signal electrodes 331B and the driving signal terminal 332B, and the driving ground electrodes 341B and the driving ground terminal 342B are respectively indicated by different hatchings. Electrodes, wires, and terminals formed on the side surfaces of the resonator substrate 2B are indicated by thick lines.

The detection signal electrodes 311B are formed on the upper surfaces and the lower surfaces (portions excluding the hammerheads 2211B and 2221B) of the first and second detection arms 221B and 222B. The detection signal electrodes 311B are electrodes for detecting, when detection resonation of the first and second detection arms 221B and 222B is excited, charges generated by the resonation.

The detection signal terminals 312B are formed at right side end portions of the first and second supporting sections 251B and 252B. The detection signal terminal 312B formed in the first supporting section 251B is electrically connected to the detection signal electrode 311B formed in the first detection arm 221B via a detection signal wire formed in the first beam 261B. On the other hand, the detection signal terminal 312B formed in the second supporting section 252B is electrically connected to the detection signal electrode 311B formed in the second detection arm 222B via a detection signal wire formed in the second beam 262B.

The detection ground electrodes 321B are formed on both the side surfaces of the first and second detection arms 221B and 222B. The detection ground electrodes 321B formed on both the side surfaces of the first detection arm 221B are electrically connected through the hammerhead 2211B. The detection ground electrodes 321B formed on both the side surfaces of the second detection arm 222B are electrically connected through the hammerhead 2221B. The detection ground electrodes 321B have potential serving as ground for the detection signal electrodes 311B.

The detection ground terminals 322B are formed in the centers of the first and second supporting sections 251B and 252B. The detection ground terminal 322B formed in the first supporting section 251B is electrically connected to the detection ground electrode 321B formed in the first detection arm 221B via a detection ground wire formed in the first beam 261B. On the other hand, the detection ground terminal 322B formed in the second supporting section 252B is electrically connected to the detection ground electrode 321B formed in the second detection arm 222B via a detection ground wire formed in the second beam 262B.

Since the detection signal electrodes 311B, the detection signal terminals 312B, the detection ground electrodes 321B, and the detection ground terminals 322B are disposed in this way, detection resonation generated in the first detection arm 221B appears as charges between the detection signal electrodes 311B and the detection ground electrodes 321B formed in the first detection arm 221B. The detection resonation can be extracted as signals from the detection signal terminals 312B and the detection ground terminals 322B formed in the first supporting section 251B. Detection resonation generated in the second detection arm 222B appears as charges between the detection signal electrodes 311B and the detection ground electrodes 321B formed in the second detection arm 222B. The detection resonation can be extracted as signals from the detection signal terminals 312B and the detection ground terminals 322B formed in the second supporting section 252B.

The driving signal electrodes 331B are formed on the upper surfaces and the lower surfaces (portions excluding the hammerheads 2411B and 2421B) of the first and second driving arms 241B and 242B. Further, the driving signal electrodes 331B are formed on both the side surfaces of the third and fourth driving arms 243B and 244B. The driving signal electrodes 331B formed on both the side surfaces of the third driving arms 243B are electrically connected through the hammerhead 2431B. The driving signal electrodes 331B formed on both the side surfaces of the fourth driving arm 244B are electrically connected through the hammerhead 2441B. The driving signal electrodes 331B are electrodes for exciting driving resonance of the first, second, third, and fourth driving arms 241B, 242B, 243B, and 244B.

The driving signal terminal 332B is formed at the left end portion of the second supporting section 252B. The driving signal terminal 332B is electrically connected to the driving signal electrodes 331B formed in the first, second, third, and fourth driving arms 241B, 242B, 243B, and 244B via a driving signal wire formed in the fourth beam 264B.

The driving ground electrodes 341B are formed on the upper surfaces and the lower surfaces (portions excluding the hammerheads 2431B and 2441B) of the third and fourth driving arms 243B and 244B. Further, the driving ground electrodes 341B are formed on both the side surfaces of the first and second driving arms 241B and 242B. The driving ground electrodes 341B formed on both the side surfaces of the first driving arm 241B are electrically connected through the hammerhead 2411B. The driving ground electrodes 341B formed on both the side surfaces of the second driving arm 242B are electrically connected through the hammerhead 2421B. The driving ground electrodes 341B have potential serving as ground for the driving signal electrodes 331B.

The driving ground terminal 342B is formed at the left end portion of the first supporting section 251B. The driving ground terminal 342B is electrically connected to the driving ground electrodes 341B formed in the first, second, third, and fourth driving arms 241B, 242B, 243B, and 244B via a driving ground wire formed in the third beam 263B.

Since the driving signal electrodes 331B, the driving signal terminal 332B, the driving ground electrodes 341B, and the driving ground terminal 342B are disposed in this way, by applying a driving signal between the driving signal terminal 332B and the driving ground terminal 342B, it is possible to generate electric fields between the driving signal electrodes 331B and the driving ground electrodes 341B formed in the first, second, third, and fourth driving arms 241B, 242B, 243B, and 244B. It is possible to cause the driving arms 241B, 242B, 243B, and 244B to perform driving resonation.

A constituent material of the electrodes is not particularly limited as long as the constituent material has electric conductivity. However, the electrodes can be formed of, for example, a metal film obtained by stacking films of Ni (nickel), Au (gold), Ag (silver), Cu (copper), or the like on a metalize layer (a foundation layer) of Cr (chrome), W (tungsten), or the like.

Driving of the Resonator Element

Driving of the resonator element 1B is explained.

In a state in which angular velocity is not applied to the resonator element 1B, when electric fields are generated between the driving signal electrodes 331B and the driving ground electrodes 341B by applying a voltage (an alternating voltage) between the driving signal terminal 332B and the driving ground terminal 342B, as shown in FIG. 16A, the driving arms 241B, 242B, 243B, and 244B perform bending resonation in a direction indicated by an arrow A. At this point, the first and second driving arms 241B and 242B and the third and fourth driving arms 243B and 244B are performing resonation surface symmetrical with respect to the YZ plane that passes the center of gravity G of the resonator element 1B. Therefore, the base section 21B, the first and second detection arms 221B and 222B, and the first and second coupling arms 231B and 232B hardly oscillate.

In a state in which the driving resonation is performed, when the angular velocity ω around the Z axis is applied to the resonator element 1B, detection resonation shown in FIG. 16B is excited. Specifically, a Coriolis force in an arrow B direction acts on the driving arms 241B, 242B, 243B, and 244B and the first and second coupling arms 231B and 232B and new resonation is excited. The resonation in the arrow B direction is resonation in the circumferential direction with respect to the center of gravity G. At the same time, detection resonation in an arrow C direction is excited in the first and second detection arms 221B and 222B in response to the resonation in the arrow B direction. Charges generated in the first and second detection arms 221B and 222B by the resonation are extracted as signals from the detection signal electrodes 311B and the detection ground electrodes 321B. Angular velocity is calculated on the basis of the signals.

In the resonator substrate 2B explained above, the first detection arm (the resonating arm) 221B, the second detection arm (the resonating arm) 222B, the first driving arm (the resonating arm) 241B, the second driving arm (the driving arm) 242B, the third driving arm (the resonating arm) 243B, and the fourth driving arm (the resonating arm) 244B respectively include the recesses on both the side surfaces of the arms. Consequently, it is possible to increase the surface area of both the side surfaces. Therefore, improvement of electric field efficiency in the detection arms 221B and 222B and the driving arms 241B, 242B, 243B, and 244B, which perform in-plane resonation, is attained. It is possible to reduce a thermoelastic loss and secure a satisfactory Q value in the detection arms 221B and 222B and the driving arms 241B, 242B, 243B, and 244B. Consequently, even if the resonator element 1B is reduced in size, it is possible to obtain sufficient electric field efficiency and secure satisfactory element characteristics. It is possible to obtain effects same as the effects of the first and embodiments.

2. Electronic Device

An electronic device applied with the resonator element according to the invention (an electronic device according to the invention) is explained.

Figure 17:
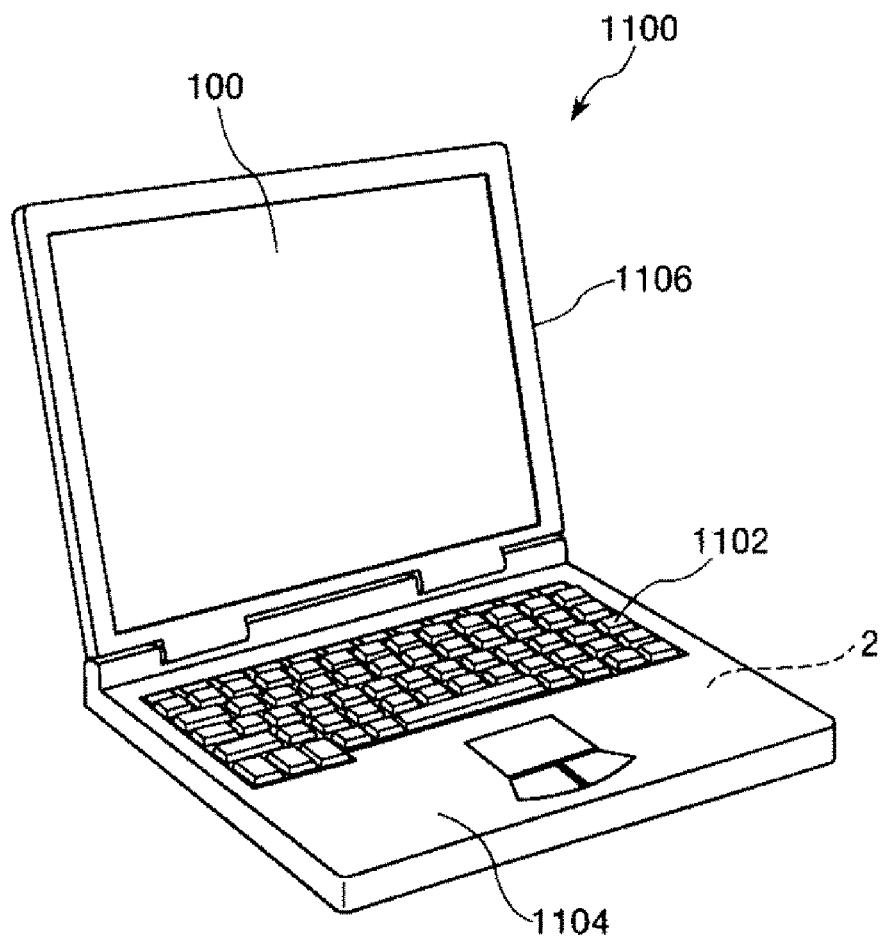
FIG. 17 is a perspective view showing the configuration of a mobile (or notebook) personal computer applied with an electronic device according to the invention.

FIG. 17 is a perspective view showing the configuration of a mobile (or notebook) personal computer applied with the electronic device according to the invention. In the figure, a personal computer 1100 is configured by a main body section 1104 including a keyboard 1102 and a display unit 1106 including a display section 100. The display unit 1106 is supported to be capable of turning with respect to the main body section 1104 via a hinge structure section. In the personal computer 1100, the resonator element 2 functioning as a filter, a resonator, a reference clock, and the like is incorporated. Note that the resonator elements 2A and 2B in the second and third embodiments may be incorporated.

Figure 18:
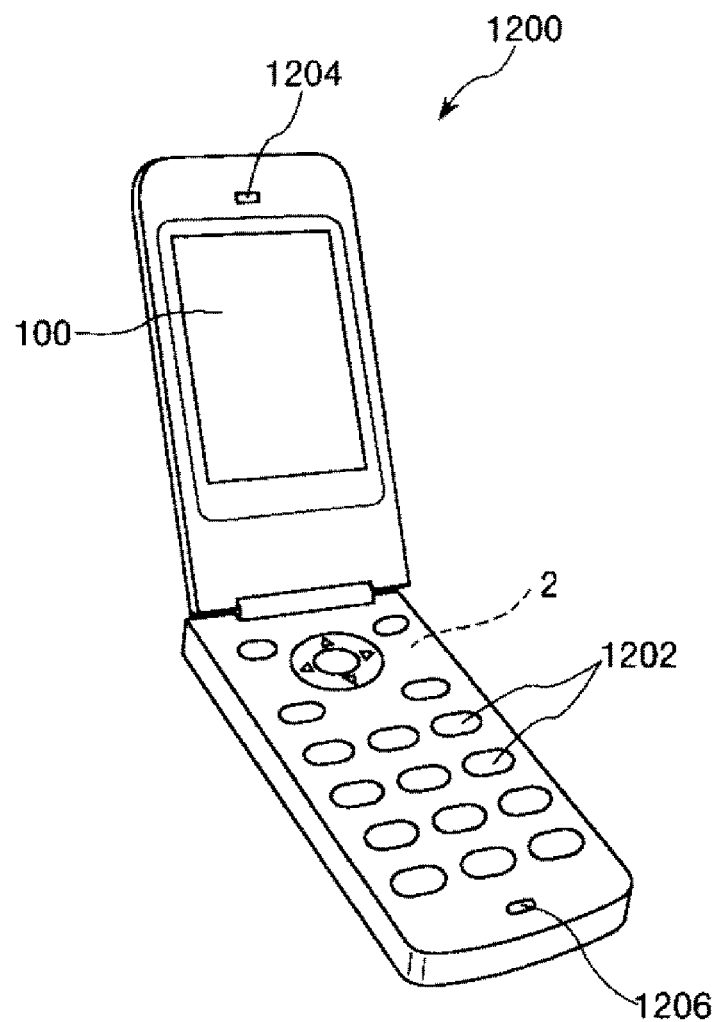
FIG. 18 is a perspective view showing the configuration of a cellular phone (including a PHS) applied with the electronic device according to the invention.

FIG. 18 is a perspective view showing the configuration of a cellular phone (including a PHS) applied with the electronic device according to the invention. In the figure, a cellular phone 1200 includes a plurality of operation buttons 1202, an earpiece 1204, and a mouthpiece 1206. A display section 100 is disposed between the operation buttons 1202 and the earpiece 1204. In the cellular phone 1200, the resonator element 2 functioning as a filter, a resonator, and the like is incorporated. Note that the resonator elements 2A and 2B in the second and third embodiments may be incorporated.

Figure 19:
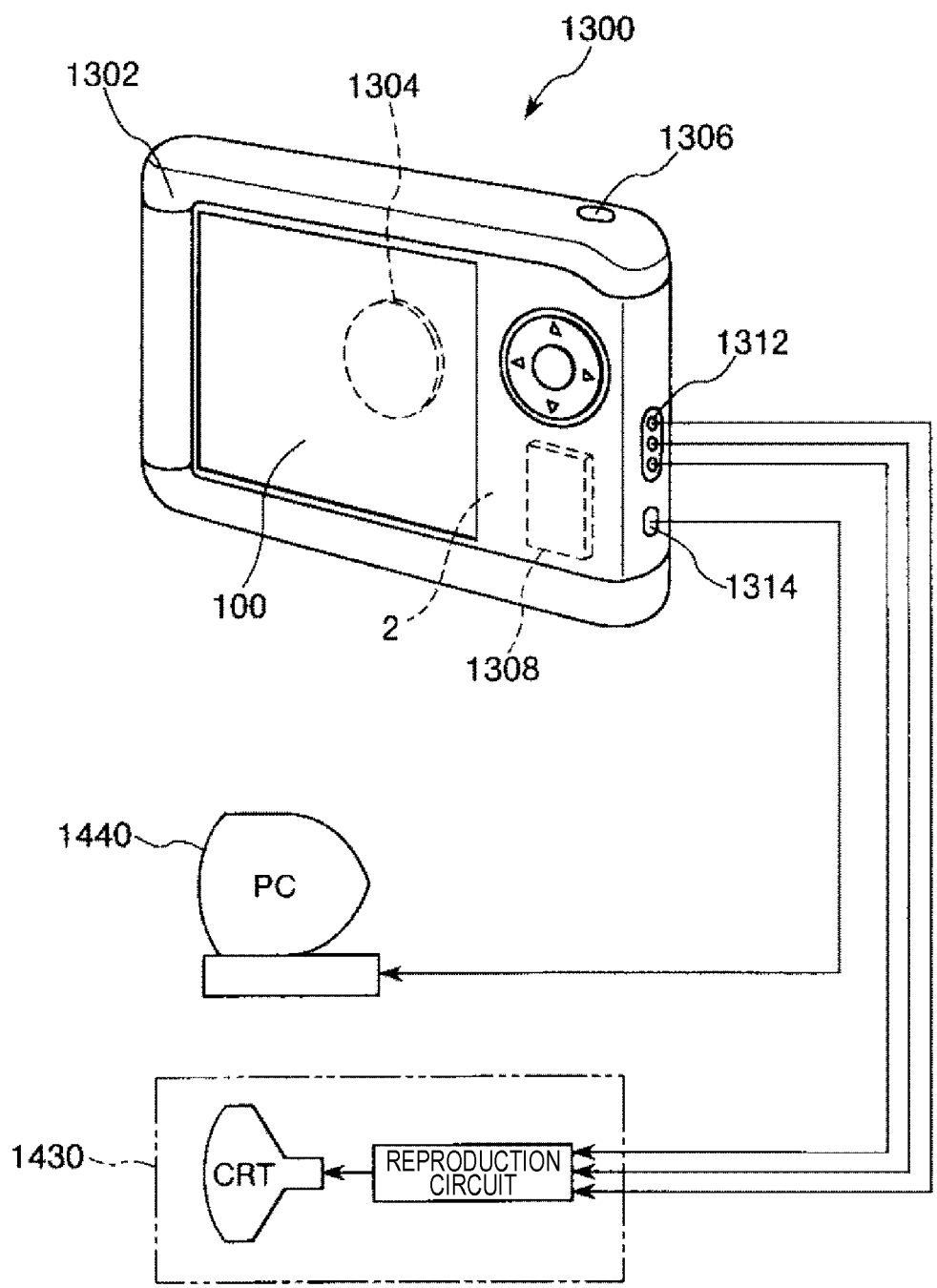
FIG. 19 is a perspective view showing the configuration of a digital still camera applied with the electronic device according to the invention.

FIG. 19 is a perspective view showing the configuration of a digital still camera applied with the electronic device according to the invention. Note that, in the figure, connection to external devices is also simply shown. Whereas a normal camera exposes a silver salt photographic film with an optical image of an object, a digital still camera 1300 photoelectrically converts the optical image of the object with an image pickup device such as a CCD (Charge Coupled Device) and generates an image pickup signal (an image signal).

A display section is provided on the back of a case (a body) 1302 in the digital still camera 1300. Display is performed on the basis of the image pickup signal by the CCD. The display section functions as a finder that displays the object as an electronic image. On the front side (the back side in the figure) of the case 1302, a light receiving unit 1304 including an optical lens (an image pickup optical system) and a CCD is provided.

When a photographer checks an object image displayed on the display section and depresses a shutter button 1306, an image pickup signal of the CCD at that point is transferred to and stored in a memory 1308. In the digital still camera 1300, a video signal output terminal 1312 and an input/output terminal 1314 for data communication are provided on a side surface of the case 1302. As shown in the figure, a television monitor 1430 is connected to the video signal output terminal 1312 and a personal computer 1440 is connected to the input/output terminal 1314 for data communication according to necessity. Further, the image pickup signal stored in the memory 1308 is output to the television monitor 1430 and the personal computer 1440 by predetermined operation. In the digital still camera 1300, the resonator element 2 functioning as a filter, a resonator, and the like is incorporated. Note that the resonator elements 2A and 2B in the second and third embodiments may be incorporated.

Note that the electronic device including the resonator element according to the invention can be applied to, besides the personal computer (the mobile personal computer) shown in FIG. 17, the cellular phone shown in FIG. 18, and the digital still camera shown in FIG. 19, for example, an inkjet-type discharge apparatus (e.g., an inkjet printer), a laptop personal computer, a television, a video camera, a video tape recorder, a car navigation apparatus, a pager, an electronic notebook (including an electronic notebook with a communication function), an electronic dictionary, an electronic calculator, an electronic game machine, a word processor, a work station, a video phone, a security television monitor, an electronic binocular, a POS terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), and a flight simulator.

3. Moving Object

A moving object applied with the resonator element according to the invention (a moving object according to the invention) is explained.

Figure 20:
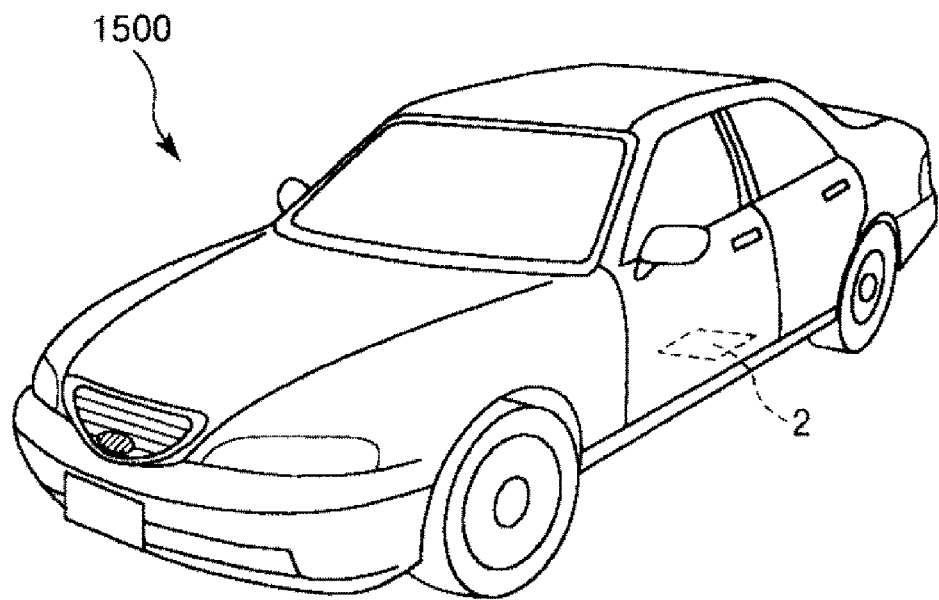
FIG. 20 is a perspective view showing the configuration of an automobile applied with a moving object according to the invention.

FIG. 20 is a perspective view showing the configuration of an automobile applied with the moving object according to the invention. The resonator element 2 is mounted on an automobile 1500. The resonator element 2 can be widely applied to electronic control units (ECU) for keyless entry, an immobilizer, a car navigation system, a car air conditioner, an antilock braking system (ABS), an airbag, a tire pressure monitoring system (TPMS: tire Pressure Monitoring System), an engine control, a battery monitor of a hybrid vehicle and an electric vehicle, a vehicle body posture control system, and the like. Note that the resonator elements 2A and 2B in the second and third embodiments may be incorporated.

The resonator element, the manufacturing method for the resonator element, the resonator, the electronic device, and the moving object according to the invention are explained above on the basis of the embodiments shown in the figures. However, the invention is not limited to this. Components of the sections can be replaced with any components having the same functions. Any other components may be added to the invention.

The invention may be combinations of any two or more components (characteristics) of the embodiments.

The entire disclosure of Japanese Patent Application No. 2014-151841, filed Jul. 25, 2014 is expressly incorporated by reference herein.

What is claimed is:

1. A resonator element comprising a resonating arm extending in a length direction and vibrating in a width direction, the resonating arm having two principal surfaces and two sidewall surfaces, the two principal surfaces being in front-back relation to each other and the two sidewall surfaces being in front-back relation to each other, each of the two sidewall surfaces extending in the length direction and in a thickness direction orthogonal to the length direction and the width direction, wherein
   recesses extending in the length direction are formed respectively on the two sidewall surfaces, and
   each of the recesses has a surface shape concave curved along a thickness direction orthogonal to the length direction and the width direction of the resonating arm.

2. The resonator element according to claim 1, wherein the recesses are symmetrical to a plane crossing a resonating direction of a bending resonation.

3. The resonator element according to claim 1, wherein, a plurality of surfaces having curvatures different from one another are provided in the recesses.

4. The resonator element according to claim 1, wherein quartz crystal is included in a material of the resonating arm.

5. The resonator element according to claim 2, wherein quartz crystal is included in a material of the resonating arm.

6. The resonator element according to claim 3, wherein quartz crystal is included in a material of the resonating arm.

7. The resonator element according to claim 1, wherein the resonator element is formed in a tuning fork shape.

8. The resonator element according to claim 2, wherein the resonator element is formed in a tuning fork shape.

9. The resonator element according to claim 3, wherein the resonator element is formed in a tuning fork shape.

10. A resonator comprising:
    the resonator element according to claim 1; and
    a package in which the resonator element is housed.

11. An electronic device comprising the resonator element according to claim 1.

12. A moving object comprising the resonator element according to claim 1.

13. A resonator comprising:
    a base;

a resonating arm extending from the base, the resonating arm having a substantially H-shaped cross-section, the resonating arm including a pair of side walls being in front-back relation to each other and a cross beam connecting the pair of side walls and defining a principal surface, the side walls defining a pair of oppositely opening grooves, and a weight at a distal end of the resonating arm, wherein the resonating arm vibrates around a bending resonation axis, and each of the grooves intersects the bending resonation axis.

14. The resonator according to claim 13, wherein a longitudinally extending planar surface on each of the pair of side walls uninterruptedly extends from a first end of the side wall to a junction between the longitudinally extending planar surface and a curved recess surface of each of the grooves, and the curved recess surface uninterruptedly extends from a second end of the side wall opposite the first end to the junction between the longitudinally extending planar surface and the curved recess surface.

15. The resonator according to claim 14, wherein a location of the junction between the longitudinally extending planar surface and the curved recess is vertically offset from the cross beam.

\* \* \* \* \*